(12) United States Patent
Meixner

(10) Patent No.: US 10,915,319 B2
(45) Date of Patent: Feb. 9, 2021

(54) TWO DIMENSIONAL MASKED SHIFT INSTRUCTION

(71) Applicant: Google LLC, Mountain View, CA (US)

(72) Inventor: Albert Meixner, Mountain View, CA (US)

(73) Assignee: Google LLC, Mountain View, CA (US)

( * ) Notice: Subject to any disclaimer, the term of this patent is extended or adjusted under 35 U.S.C. 154(b) by 96 days.

(21) Appl. No.: 15/595,600

(22) Filed: May 15, 2017

(65) Prior Publication Data

US 2018/0329479 A1    Nov. 15, 2018

(51) Int. Cl.
| | |
|---|---|
| *G06F 9/30* | (2018.01) |
| *G06F 3/00* | (2006.01) |
| *G11C 19/38* | (2006.01) |
| *G06T 7/73* | (2017.01) |
| *H04N 19/44* | (2014.01) |
| *G06T 1/20* | (2006.01) |
| *G06F 15/80* | (2006.01) |

(52) U.S. Cl.
CPC .......... *G06F 9/30032* (2013.01); *G06F 3/007* (2013.01); *G06F 9/30018* (2013.01); *G06F 15/80* (2013.01); *G06T 1/20* (2013.01); *G06T 7/73* (2017.01); *G11C 19/38* (2013.01); *H04N 19/44* (2014.11)

(58) Field of Classification Search
None
See application file for complete search history.

(56) References Cited

U.S. PATENT DOCUMENTS

| | | | |
|---|---|---|---|
| 3,544,973 A | 12/1970 | Borck, Jr. et al. | |
| 4,380,046 A | 4/1983 | Fosch et al. | |
| 6,006,316 A * | 12/1999 | Dinkjian | G06F 7/57 708/524 |
| 6,067,609 A | 5/2000 | Meeker et al. | |
| 2005/0125638 A1* | 6/2005 | Ford | G06F 9/30025 712/221 |
| 2008/0049774 A1 | 2/2008 | Swenson et al. | |
| 2009/0177724 A1 | 7/2009 | Krithivasan et al. | |
| 2010/0290506 A1 | 11/2010 | Kerr et al. | |

(Continued)

FOREIGN PATENT DOCUMENTS

| | | |
|---|---|---|
| TW | 454125 | 9/2001 |
| TW | I315034 | 9/2009 |

OTHER PUBLICATIONS

Written Opinion issued in International Application No. PCT/US2018/013059, dated Sep. 20, 2018, 7 pages.

(Continued)

*Primary Examiner* — Corey S Faherty
(74) *Attorney, Agent, or Firm* — Fish & Richardson P.C.

(57) ABSTRACT

An image processor is described. The image processor includes a two dimensional shift register array that couples certain ones of its array locations to support execution of a shift instruction. The shift instruction is to include mask information. The mask information is to specify which of the array locations are to be written to with information being shifted. The two dimensional shift register array includes masking logic circuitry to write the information being shifted into specified ones of the array locations in accordance with the mask information.

21 Claims, 55 Drawing Sheets

(56) References Cited

U.S. PATENT DOCUMENTS

2015/0369893 A1    12/2015    Takeshima

OTHER PUBLICATIONS

International Search Report and Written Opinion issued in International Application No. PCT/US2018/013059, dated Apr. 19, 2018, 16 pages.
Slotnick et al. "The Solomon Computer," Proceedings of the Fall Joint Computer Conference, Dec. 1, 1962, 12 pages.
Gall, "A Hardware-Integrated GPC/Search Memory," Proceedings of the joint computer conference, part I. ACM, Oct. 27-29, 1964, 16 pages.
Samuel et al., "Masked AES with Power Reduction using Pipeline Implementation for SAN," International Journal of Engineering Research and Technology, Mar. 2014, 3(3), 5 pages.
Zidan et al., "Field-Programmable Crossbar Array (FPCA) for Reconfigurable Computing," IEEE Transactions on Multi-Scale Computing Systems, Jun. 2017, 16 pages.
TW Office Action issued in Taiwanese Application No. 107103788, dated Feb. 27, 2019, 6 pages (English translation).

* cited by examiner

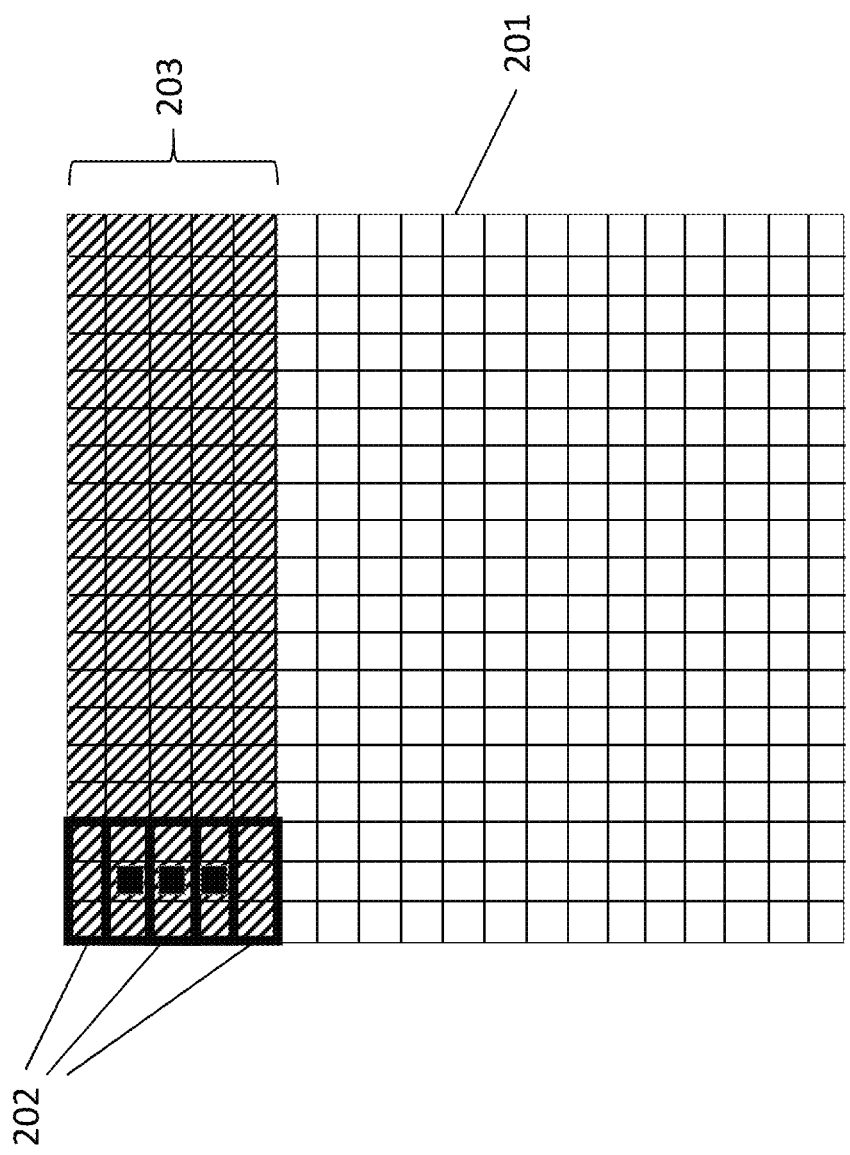

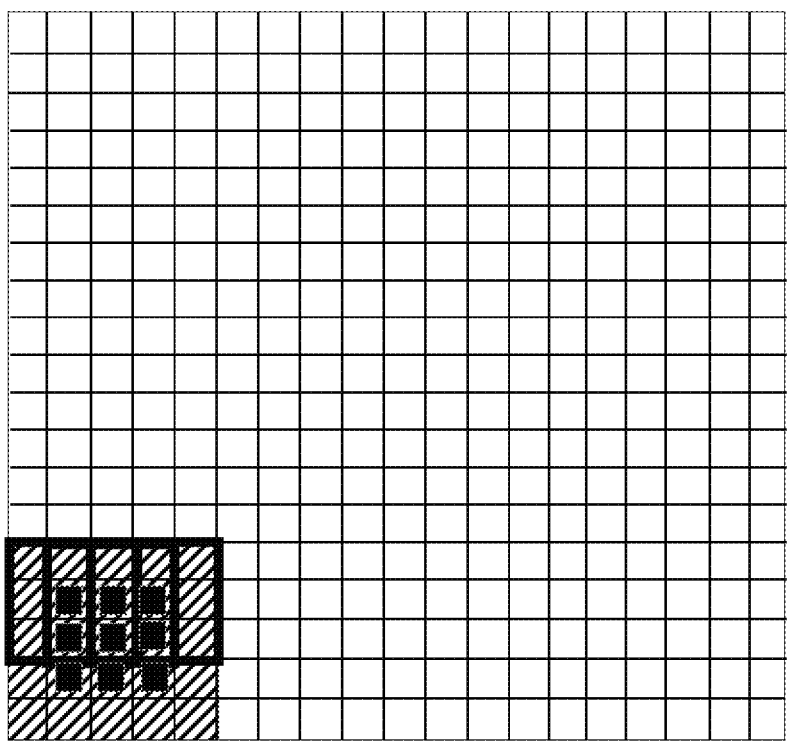

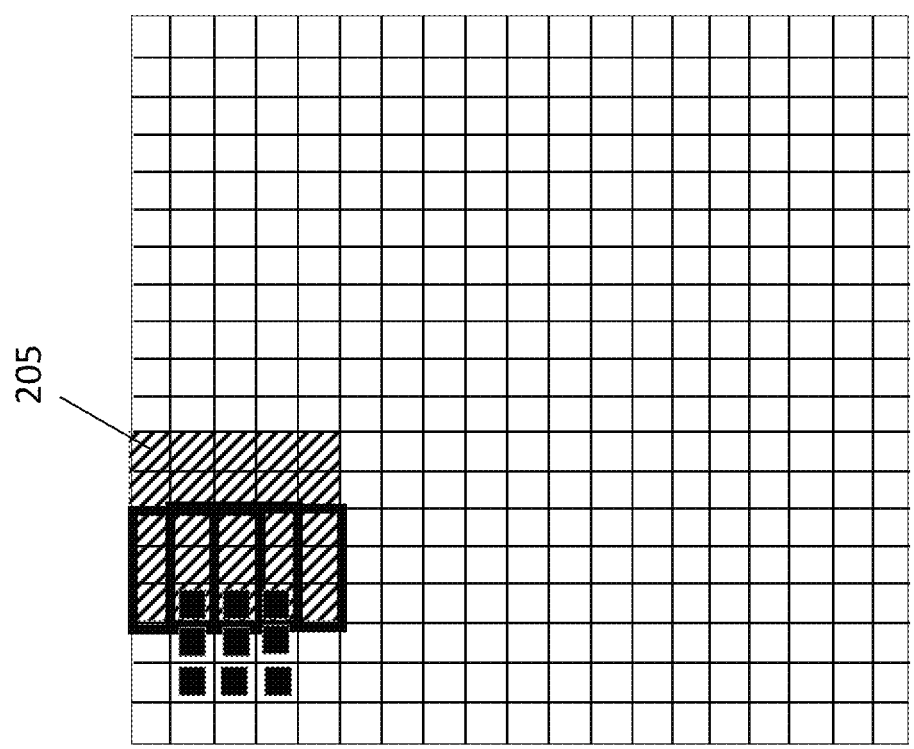

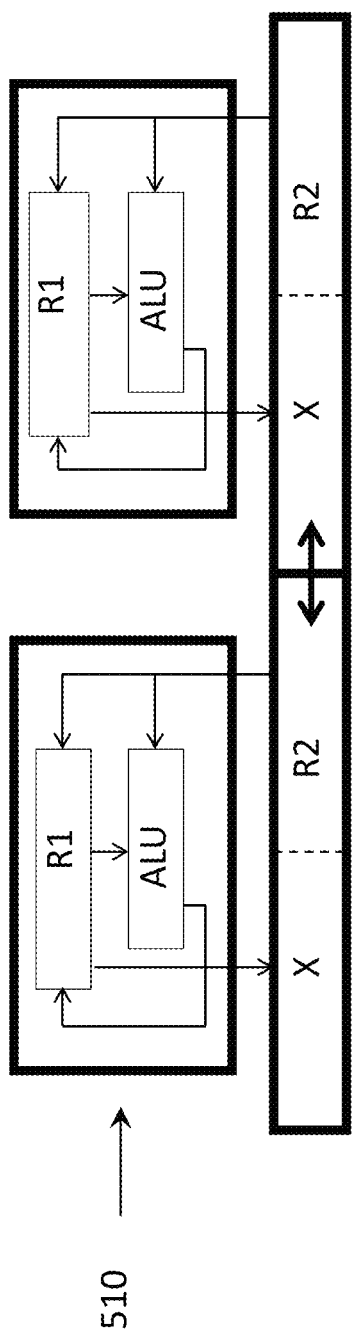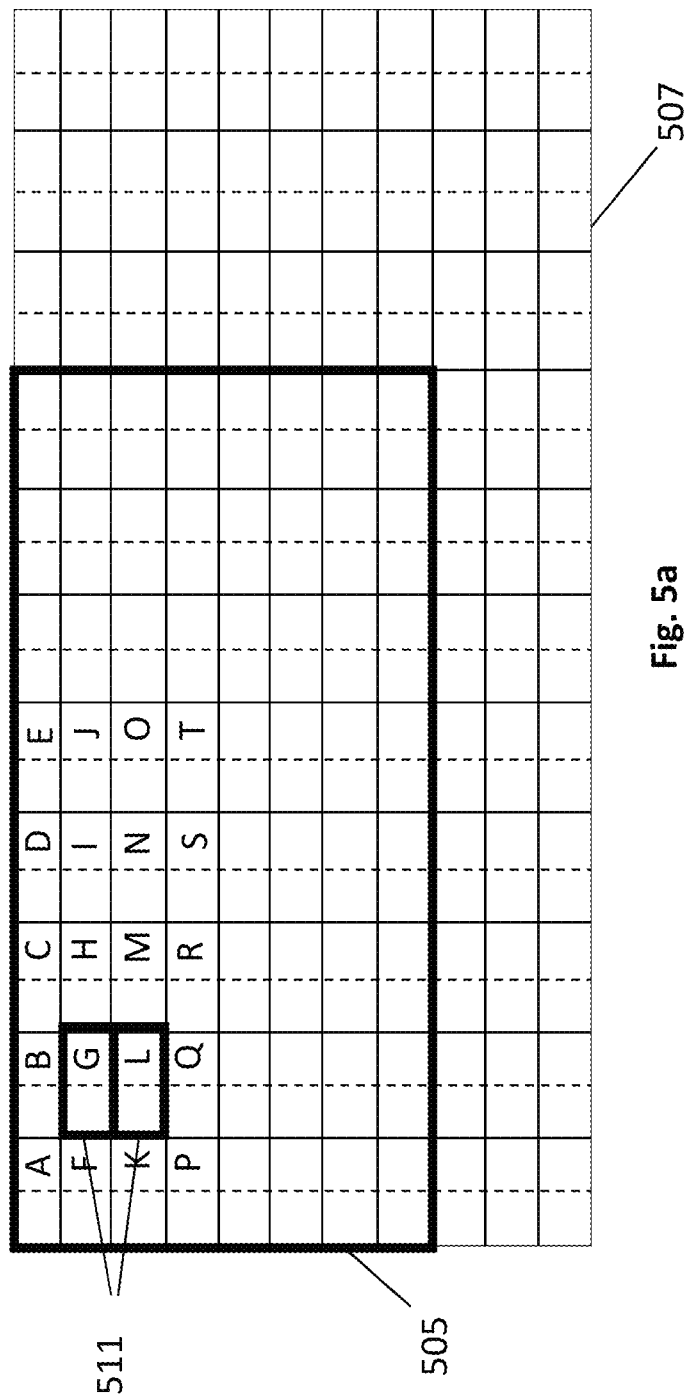
Fig. 5a

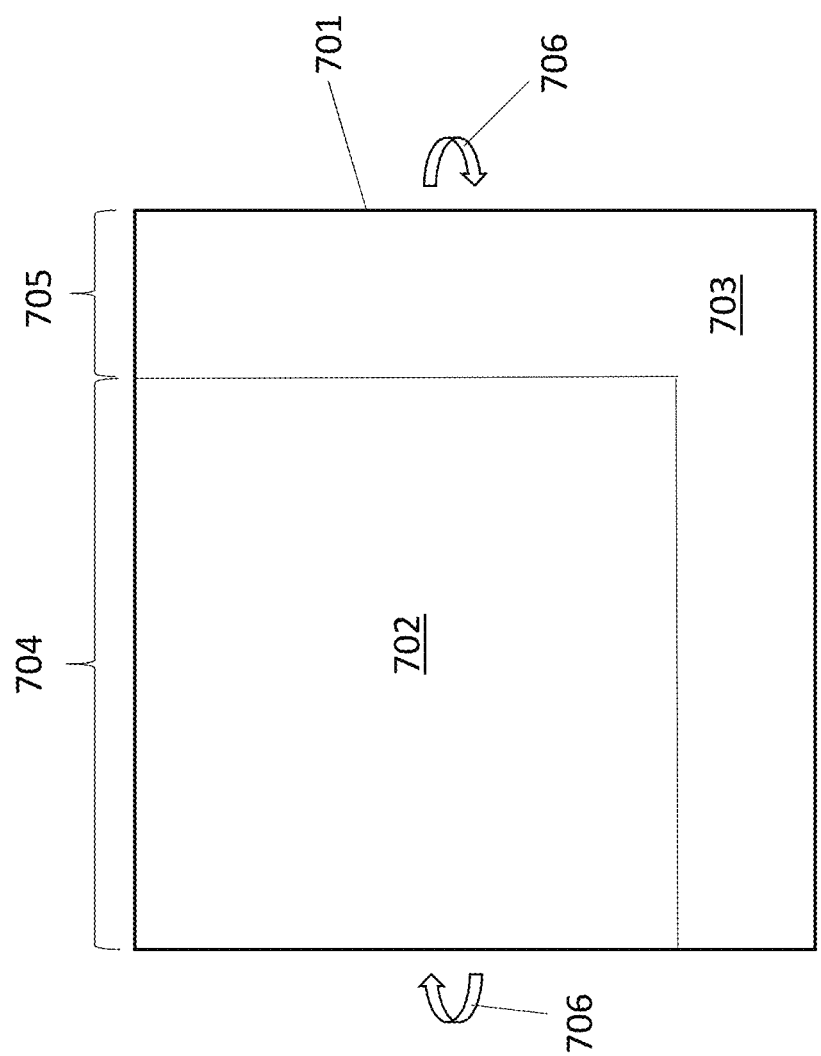

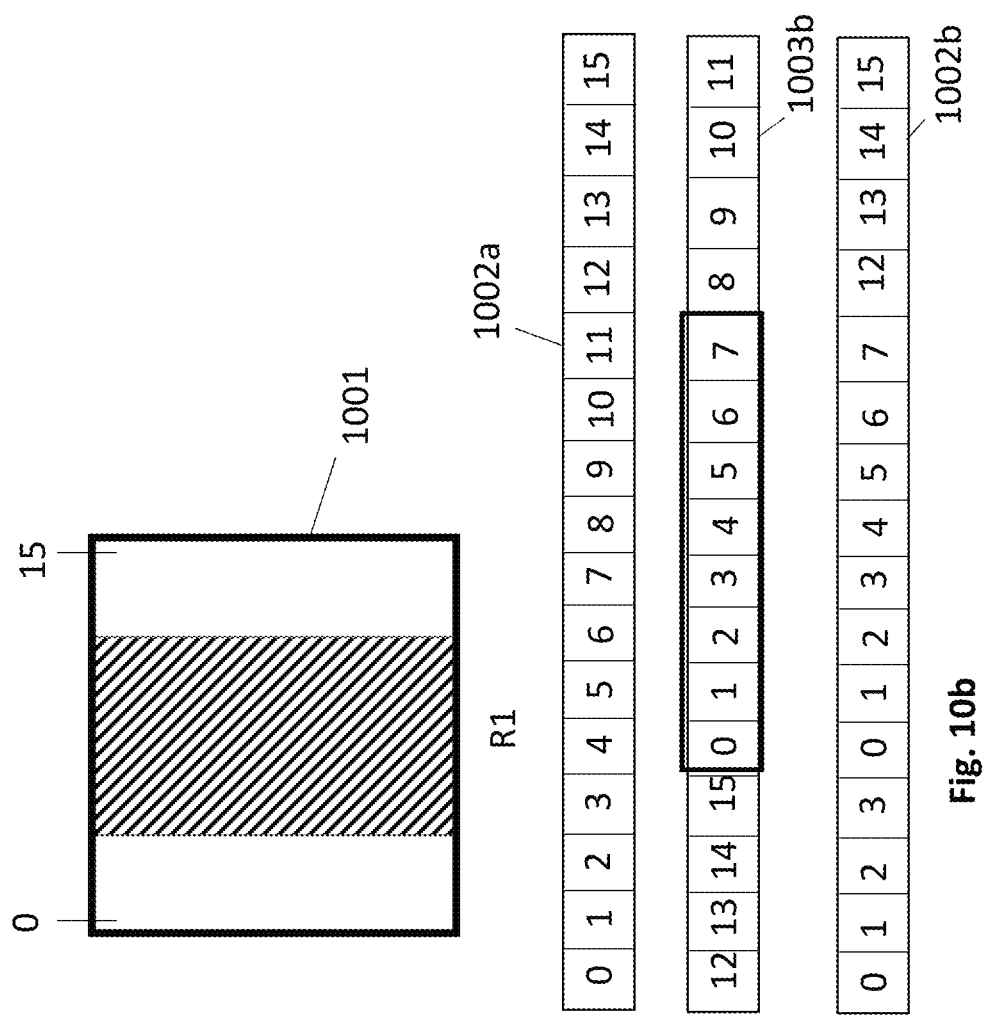

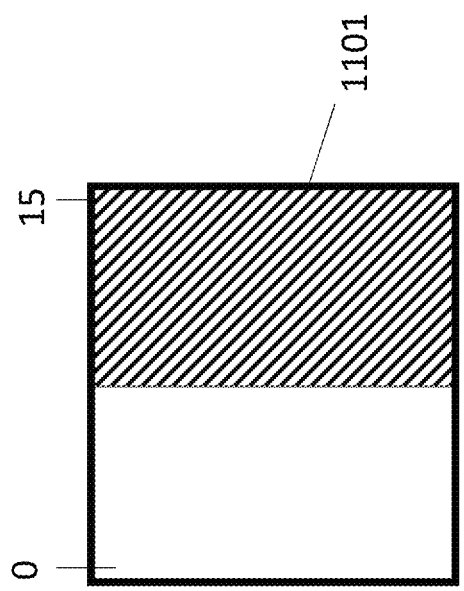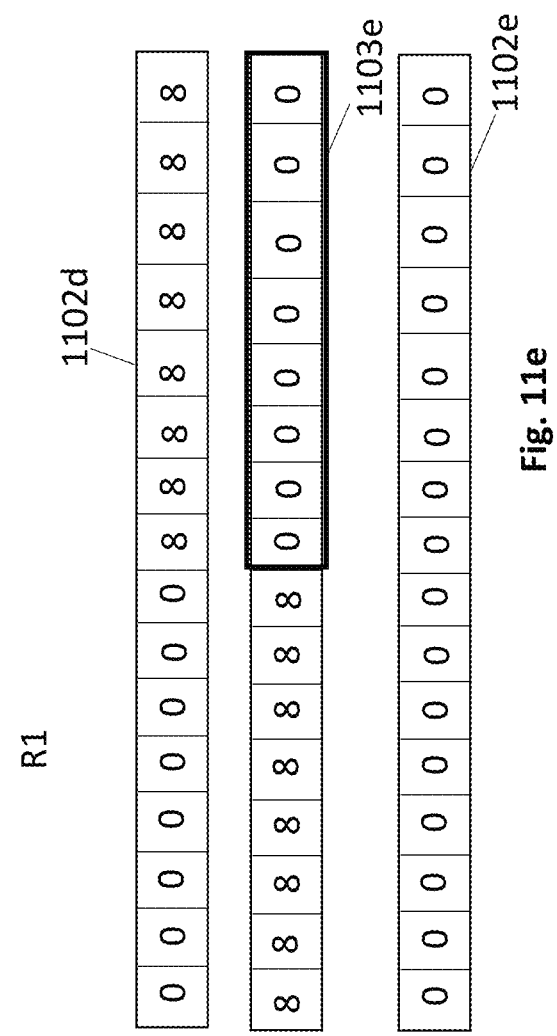
Fig. 11e

TWO DIMENSIONAL MASKED SHIFT INSTRUCTION

FIELD OF INVENTION

The field of invention pertains generally to image processing, and, more specifically, to a two dimensional masked shift instruction.

BACKGROUND

Image processing typically involves the processing of pixel values that are organized into an array. Here, a spatially organized two dimensional array captures the two dimensional nature of images (additional dimensions may include time (e.g., a sequence of two dimensional images) and data type (e.g., colors). In a typical scenario, the arrayed pixel values are provided by a camera that has generated a still image or a sequence of frames to capture images of motion. Traditional image processors typically fall on either side of two extremes.

A first extreme performs image processing tasks as software programs executing on a general purpose processor or general purpose-like processor (e.g., a general purpose processor with vector instruction enhancements). Although the first extreme typically provides a highly versatile application software development platform, its use of finer grained data structures combined with the associated overhead (e.g., instruction fetch and decode, handling of on-chip and off-chip data, speculative execution) ultimately results in larger amounts of energy being consumed per unit of data during execution of the program code.

A second, opposite extreme applies fixed function hardwired circuitry to much larger blocks of data. The use of larger (as opposed to finer grained) blocks of data applied directly to custom designed circuits greatly reduces power consumption per unit of data. However, the use of custom designed fixed function circuitry generally results in a limited set of tasks that the processor is able to perform. As such, the widely versatile programming environment (that is associated with the first extreme) is lacking in the second extreme.

A technology platform that provides for both highly versatile application software development opportunities combined with improved power efficiency per unit of data remains a desirable yet missing solution.

SUMMARY

An image processor is described. The image processor includes a two dimensional shift register array that couples certain ones of its array locations to support execution of a shift instruction. The shift instruction is to include mask information. The mask information is to specify which of the array locations are to be written to with information being shifted. The two dimensional shift register array includes masking logic circuitry to write the information being shifted into specified ones of the array locations in accordance with the mask information.

FIGURES

The following description and accompanying drawings are used to illustrate embodiments of the invention. In the drawings:

FIGS. 2a, 2b, 2c, 2d and 2e depict the parsing of image data into a line group, the parsing of a line group into a sheet and the operation performed on a sheet with overlapping stencils;

FIGS. 5a, 5b, 5c, 5d, 5e, 5f, 5g, 5h, 5i, 5j and 5k depict an example of the use of a two-dimensional shift array and an execution lane array to determine a pair of neighboring output pixel values with overlapping stencils;

FIG. 6b shows an embodiment of the masking logic circuitry of FIG. 6a;

FIG. 7 shows a two dimensional shift register array and halo region;

FIGS. 10a, 10b, 10c, 10d and 10e show a process for expanding image data using masked shift instructions;

FIGS. 11a, 11b, 11c, 11d and 11e show a process for broadcasting image data using masked shift instructions;

DETAILED DESCRIPTION i. Introduction

The description below describes numerous embodiments concerning a new image processing technology platform that provides a widely versatile application software development environment that uses larger blocks of data (e.g., line groups and sheets as described further below) to provide for improved power efficiency.

Figure 1:
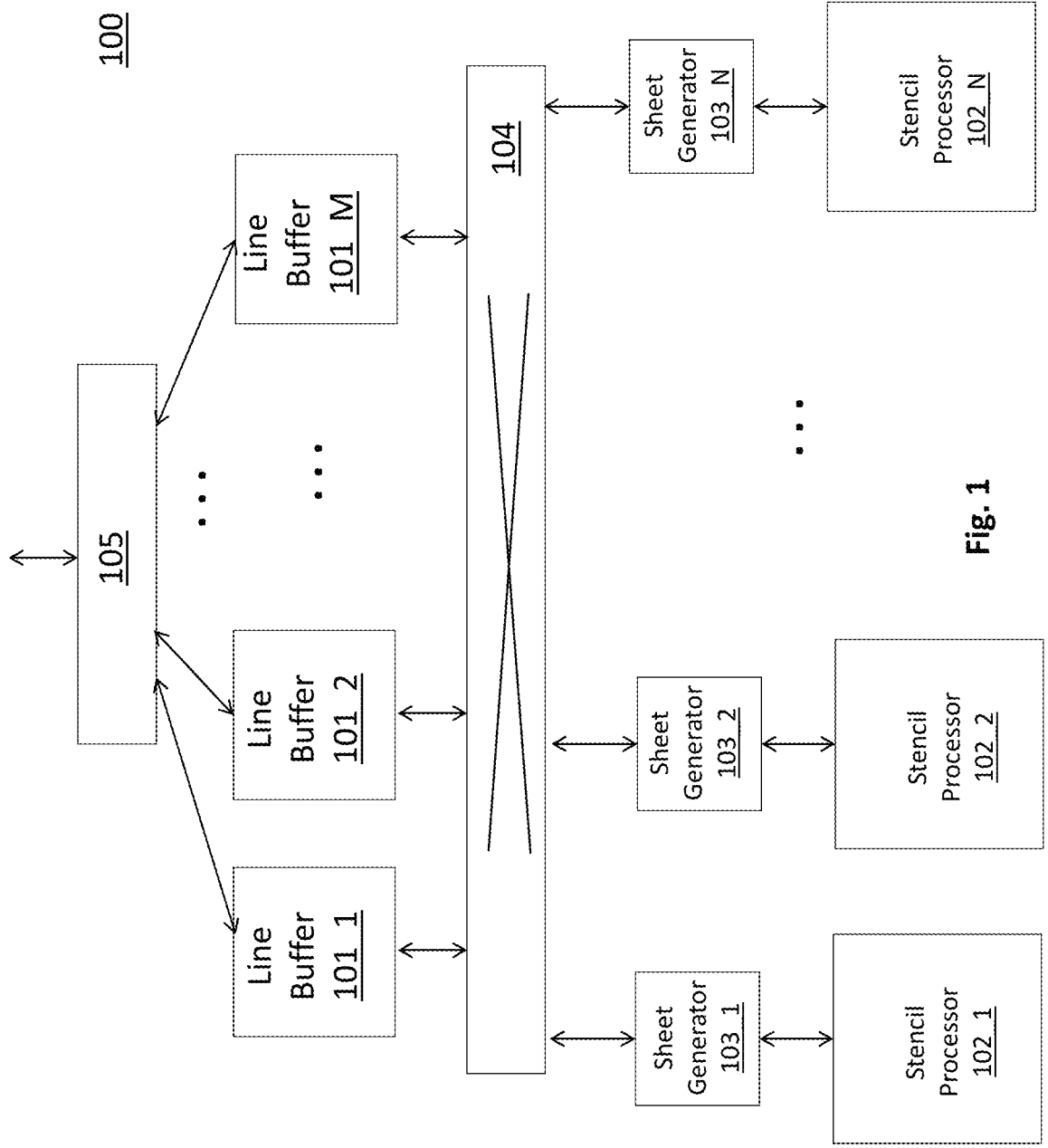
FIG. 1 shows an embodiment of an image processor hardware architecture.

1.0 Hardware Architecture Embodiments a. Image Processor Hardware Architecture and Operation FIG. 1 shows an embodiment of an architecture 100 for an image processor implemented in hardware. The image processor may be targeted, for example, by a compiler that converts program code written for a virtual processor within a simulated environment into program code that is actually executed by the hardware processor. As observed in FIG. 1, the architecture 100 includes a plurality of line buffer units 101_1 through 101_M (hereinafter "line buffers", "line buffer units" or the like) interconnected to a plurality of stencil processor units 102_1 through 102_N (hereinafter, "stencil processors", "stencil processor units" or the like) and corresponding sheet generator units 103_1 through 103_N (hereinafter "sheet generators", "sheet generator units" or the like) through a network 104 (e.g., a network on chip (NOC) including an on chip switch network, an on chip ring network or other kind of network). In an embodiment, any line buffer unit may connect to any sheet generator and corresponding stencil processor through the network 104.

In an embodiment, program code is compiled and loaded onto a corresponding stencil processor 102 to perform the image processing operations earlier defined by a software developer (program code may also be loaded onto the stencil processor's associated sheet generator 103, e.g., depending on design and implementation). In at least some instances an image processing pipeline may be realized by loading a first kernel program for a first pipeline stage into a first stencil processor 102_1, loading a second kernel program for a second pipeline stage into a second stencil processor 102_2, etc. where the first kernel performs the functions of the first stage of the pipeline, the second kernel performs the functions of the second stage of the pipeline, etc. and additional control flow methods are installed to pass output image data from one stage of the pipeline to the next stage of the pipeline.

In other configurations, the image processor may be realized as a parallel machine having two or more stencil processors 102_1, 102_2 operating the same kernel program code. For example, a highly dense and high data rate stream of image data may be processed by spreading frames across multiple stencil processors each of which perform the same function.

In yet other configurations, essentially any DAG of kernels may be loaded onto the hardware processor by configuring respective stencil processors with their own respective kernel of program code and configuring appropriate control flow hooks into the hardware to direct output images from one kernel to the input of a next kernel in the DAG design.

As a general flow, frames of image data are received by a macro I/O unit 105 and passed to one or more of the line buffer units 101 on a frame-by-frame basis. A particular line buffer unit parses its frame of image data into a smaller region of image data, referred to as a "line group", and then passes the line group through the network 104 to a particular sheet generator. A complete or "full" singular line group may be composed, for example, with the data of multiple contiguous complete rows or columns of a frame (for brevity the present specification will mainly refer to contiguous rows). The sheet generator further parses the line group of image data into a smaller region of image data, referred to as a "sheet", and presents the sheet to its corresponding stencil processor.

In the case of an image processing pipeline or a DAG flow having a single input, generally, input frames are directed to the same line buffer unit 101_1 which parses the image data into line groups and directs the line groups to the sheet generator 103_1 whose corresponding stencil processor 102_1 is executing the code of the first kernel in the pipeline/DAG. Upon completion of operations by the stencil processor 102_1 on the line groups it processes, the sheet generator 103_1 sends output line groups to a "downstream" line buffer unit 101_2 (in some use cases the output line group may be sent_back to the same line buffer unit 101_1 that earlier had sent the input line groups).

One or more "consumer" kernels that represent the next stage/operation in the pipeline/DAG executing on their own respective other sheet generator and stencil processor (e.g., sheet generator 103_2 and stencil processor 102_2) then receive from the downstream line buffer unit 101_2 the image data generated by the first stencil processor 102_1. In this manner, a "producer" kernel operating on a first stencil processor has its output data forwarded to a "consumer" kernel operating on a second stencil processor where the consumer kernel performs the next set of tasks after the producer kernel consistent with the design of the overall pipeline or DAG.

A stencil processor 102 is designed to simultaneously operate on multiple overlapping stencils of image data. The multiple overlapping stencils and internal hardware processing capacity of the stencil processor effectively determines the size of a sheet. Here, within a stencil processor 102, arrays of execution lanes operate in unison to simultaneously process the image data surface area covered by the multiple overlapping stencils.

As will be described in more detail below, in various embodiments, sheets of image data are loaded into a two-dimensional register array structure within the stencil processor 102. The use of sheets and the two-dimensional register array structure is believed to effectively provide for power consumption improvements by moving a large amount of data into a large amount of register space as, e.g., a single load operation with processing tasks performed directly on the data immediately thereafter by an execution lane array. Additionally, the use of an execution lane array and corresponding register array provide for different stencil sizes that are easily programmable/configurable.

FIGS. 2a through 2e illustrate at a high level embodiments of both the parsing activity of a line buffer unit 101, the finer grained parsing activity of a sheet generator unit 103, as well as the stencil processing activity of the stencil processor 102 that is coupled to the sheet generator unit 103.

FIG. 2a depicts an embodiment of an input frame of image data 201. FIG. 2a also depicts an outline of three overlapping stencils 202 (each stencil having a dimension of 3 pixels by 3 pixels) that a stencil processor is designed to operate over. The output pixel that each stencil respectively generates output image data for is highlighted in solid black. For brevity, the three overlapping stencils 202 are depicted as overlapping only in the vertical direction. It is pertinent to recognize that in actuality a stencil processor may be designed to have overlapping stencils in both the vertical and horizontal directions.

Because of the vertical overlapping stencils 202 within the stencil processor, as observed in FIG. 2a, there exists a wide band of image data within the frame that a single stencil processor can operate over. As will be discussed in more detail below, in an embodiment, the stencil processors process data within their overlapping stencils in a left to right fashion across the image data (and then repeat for the next set of lines, in top to bottom order). Thus, as the stencil processors continue forward with their operation, the number of solid black output pixel blocks will grow right-wise horizontally. As discussed above, a line buffer unit 101 is responsible for parsing a line group of input image data from an incoming frame that is sufficient for the stencil processors to operate over for an extended number of upcoming cycles. An exemplary depiction of a line group is illustrated as a shaded region 203. In an embodiment, as described further below, the line buffer unit 101 can comprehend different dynamics for sending/receiving a line group to/from a sheet generator. For example, according to one mode, referred to as "full group", the complete full width lines of image data are passed between a line buffer unit and a sheet generator. According to a second mode, referred to as "virtually tall", a line group is passed initially with a subset of full width rows. The remaining rows are then passed sequentially in smaller (less than full width) pieces.

With the line group 203 of the input image data having been defined by the line buffer unit and passed to the sheet generator unit, the sheet generator unit further parses the line group into finer sheets that are more precisely fitted to the hardware limitations of the stencil processor. More specifically, as will be described in more detail further below, in an embodiment, each stencil processor consists of a two dimensional shift register array. The two dimensional shift register array essentially shifts image data "beneath" an array of execution lanes where the pattern of the shifting causes each execution lane to operate on data within its own respective stencil (that is, each execution lane processes on its own stencil of information to generate an output for that stencil). In an embodiment, sheets are surface areas of input image data that "fill" or are otherwise loaded into the two dimensional shift register array.

Figure 2B:
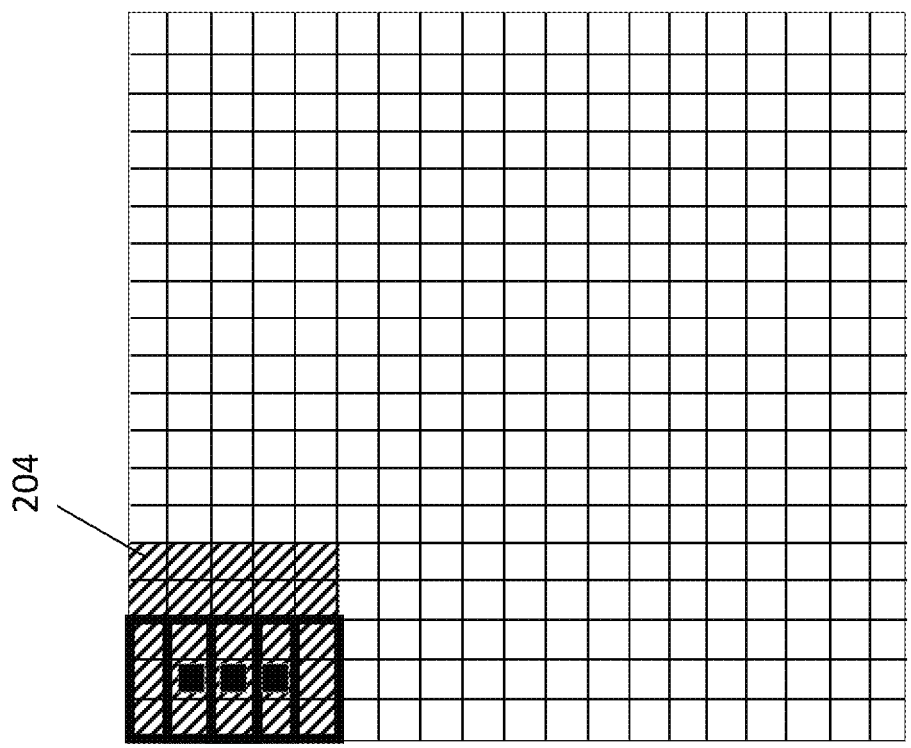
Figure 2C:
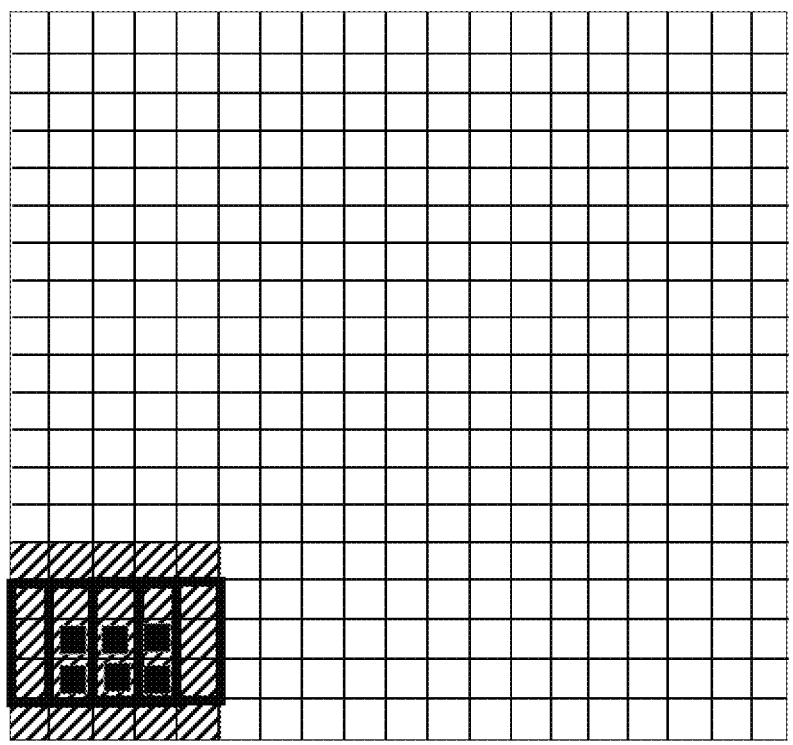

Thus, as observed in FIG. 2b, the sheet generator parses an initial sheet 204 from the line group 203 and provides it to the stencil processor (here, the exemplary sheet of data corresponds to the five by five shaded region that is generally identified by reference number 204). As observed in FIGS. 2c and 2d, the stencil processor operates on the sheet of input image data by effectively moving the overlapping stencils 202 in a left to right fashion over the sheet. As of FIG. 2d, the number of pixels for which an output value could be calculated (nine in a darkened 3 by 3 array) from the data within the sheet is exhausted (no other pixel positions can have an output value determined from the information within the sheet). For simplicity the border regions of the image have been ignored.

As observed in FIG. 2e the sheet generator then provides a next sheet 205 for the stencil processor to continue operations on. Note that the initial positions of the stencils as they begin operation on the next sheet is the next progression to the right from the point of exhaustion on the first sheet (as depicted previously in FIG. 2d). With the new sheet 205, the stencils will simply continue moving to the right as the stencil processor operates on the new sheet in the same manner as with the processing of the first sheet.

Note that there is some overlap between the data of the first sheet 204 and the data of the second sheet 205 owing to the border regions of stencils that surround an output pixel location. The overlap could be handled simply by the sheet generator re-transmitting the overlapping data twice. In alternate implementations, to feed a next sheet to the stencil processor, the sheet generator may proceed to only send new data to the stencil processor and the stencil processor reuses the overlapping data from the previous sheet.

b. Stencil Processor Design and Operation

Figure 3A:
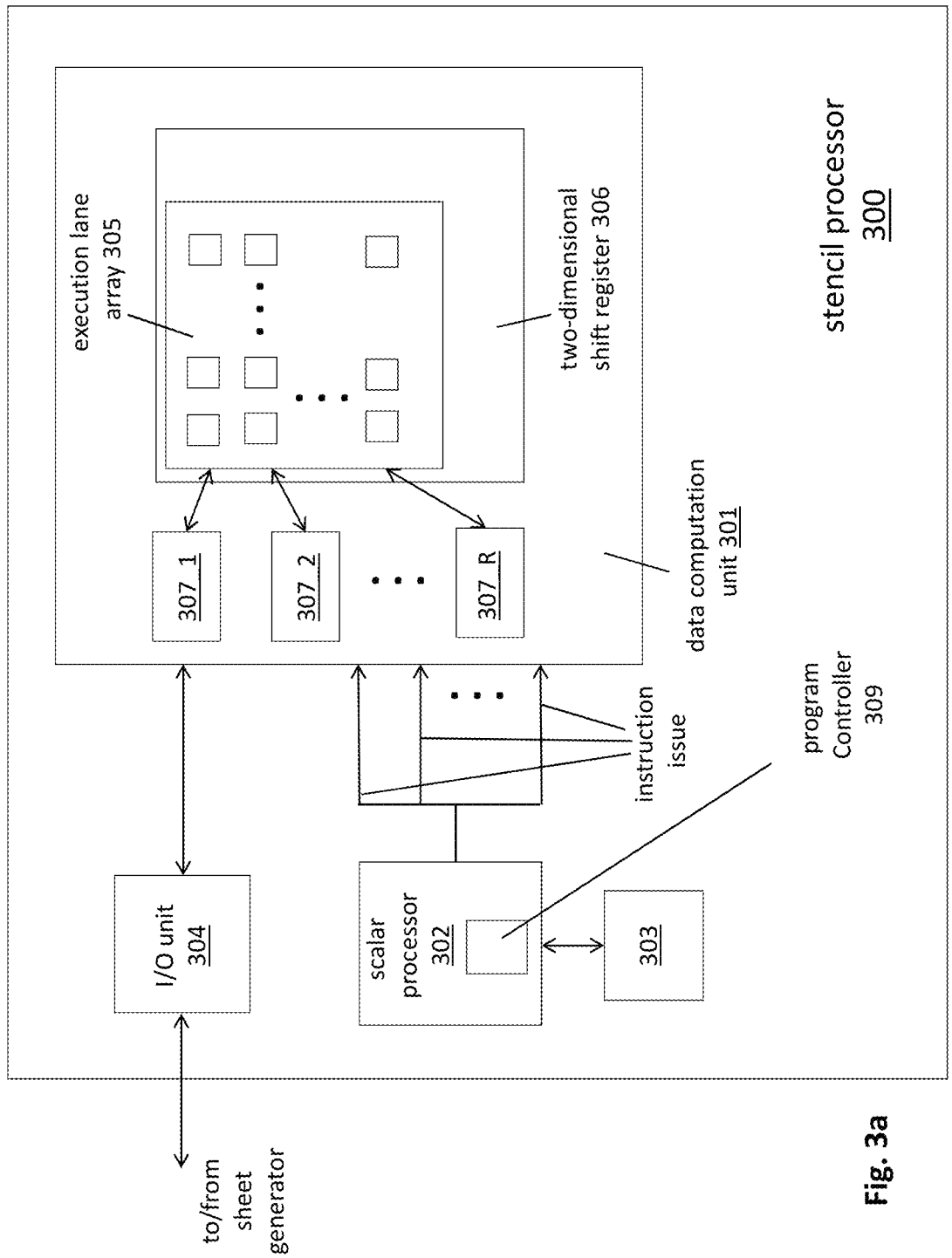
FIG. 3a shows an embodiment of a stencil processor.

FIG. 3a shows an embodiment of a stencil processor unit architecture 300. As observed in FIG. 3a, the stencil processor includes a data computation unit 301, a scalar processor 302 and associated memory 303 and an I/O unit 304. The data computation unit 301 includes an array of execution lanes 305, a two-dimensional shift array structure 306 and separate respective random access memories 307 associated with specific rows or columns of the array.

The I/O unit 304 is responsible for loading "input" sheets of data received from the sheet generator into the data computation unit 301 and storing "output" sheets of data from the stencil processor into the sheet generator. In an embodiment the loading of sheet data into the data computation unit 301 entails parsing a received sheet into rows/columns of image data and loading the rows/columns of image data into the two dimensional shift register structure 306 or respective random access memories 307 of the rows/columns of the execution lane array (described in more detail below). If the sheet is initially loaded into memories 307, the individual execution lanes within the execution lane array 305 may then load sheet data into the two-dimensional shift register structure 306 from the random access memories 307 when appropriate (e.g., as a load instruction just prior to operation on the sheet's data). Upon completion of the loading of a sheet of data into the register structure 306 (whether directly from a sheet generator or from memories 307), the execution lanes of the execution lane array 305 operate on the data and eventually "write back" finished data as a sheet directly back to the sheet generator, or, into the random access memories 307. If the execution lanes write back to random access memories 307, the I/O unit 304 fetches the data from the random access memories 307 to form an output sheet which is then forwarded to the sheet generator.

The scalar processor 302 includes a program controller 309 that reads the instructions of the stencil processor's program code from scalar memory 303 and issues the instructions to the execution lanes in the execution lane array 305. In an embodiment, a single same instruction is broadcast to all execution lanes within the array 305 to effect single instruction multiple data (SIMD)-like behavior from the data computation unit 301. In an embodiment, the instruction format of the instructions read from scalar memory 303 and issued to the execution lanes of the execution lane array 305 includes a very-long-instruction-word (VLIW) type format that includes more than one opcode per instruction. In a further embodiment, the VLIW format includes both an ALU opcode that directs a mathematical function performed by each execution lane's ALU (which, as described below, in an embodiment may specify more than one traditional ALU operation) and a memory opcode (that directs a memory operation for a specific execution lane or set of execution lanes).

The term "execution lane" refers to a set of one or more execution units capable of executing an instruction (e.g., logic circuitry that can execute an instruction). An execution lane can, in various embodiments, include more processor-like functionality beyond just execution units, however. For example, besides one or more execution units, an execution lane may also include logic circuitry that decodes a received instruction, or, in the case of more multiple instruction multiple data (MIMD)-like designs, logic circuitry that fetches and decodes an instruction. With respect to MIMD-like approaches, although a centralized program control approach has largely been described herein, a more distributed approach may be implemented in various alternative embodiments (e.g., including program code and a program controller within each execution lane of the array 305).

The combination of an execution lane array 305, program controller 309 and two dimensional shift register structure 306 provides a widely adaptable/configurable hardware platform for a broad range of programmable functions. For example, application software developers are able to program kernels having a wide range of different functional capability as well as dimension (e.g., stencil size) given that the individual execution lanes are able to perform a wide variety of functions and are able to readily access input image data proximate to any output array location.

Apart from acting as a data store for image data being operated on by the execution lane array 305, the random access memories 307 may also keep one or more look-up tables. In various embodiments one or more scalar look-up tables may also be instantiated within the scalar memory 303. Look-up tables are often used by image processing tasks to, e.g., obtain filter or transform coefficients for different array locations, implement complex functions (e.g., gamma curves, sine, cosine) where the look-up table provides the function output for an input index value, etc. Here, it is expected that SIMD image processing sequences will often perform a look-up into a same look-up table during a same clock cycle. Similarly, one or more constant tables may be stored in the scalar memory 303. Here, e.g., it is expected that the different execution lanes may need a same constant or other value on the same clock cycle (e.g., a particular multiplier to be applied against an entire image). Thus, accesses into a constant look-up table return a same, scalar value to each of the execution lanes. Look-up tables are typically accessed with an index value.

A scalar look-up involves passing the same data value from the same look-up table from the same index to each of the execution lanes within the execution lane array 305. In various embodiments, the VLIW instruction format described above is expanded to also include a scalar opcode that directs a look-up operation performed by the scalar processor into a scalar look-up table. The index that is specified for use with the opcode may be an immediate operand or fetched from some other data storage location. Regardless, in an embodiment, a look up from a scalar look-up table within scalar memory essentially involves broadcasting the same data value to all execution lanes within the execution lane array 305 during the same clock cycle. Additional details concerning the use and operation of look-up tables is provided further below.

Figure 3B:
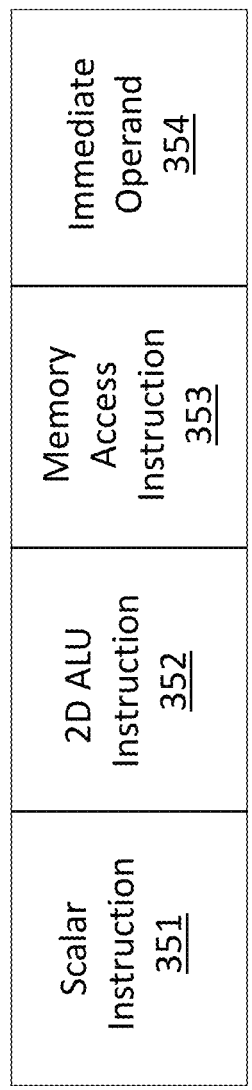
FIG. 3b shows an embodiment of a instruction word of the stencil processor.

FIG. 3b summarizes the VLIW instruction word embodiments(s) discussed above. As observed in FIG. 3b, the VLIW instruction word format includes fields for three separate instructions: 1) a scalar instruction 351 that is executed by the scalar processor; 2) an ALU instruction 352 that is broadcasted and executed in SIMD fashion by the respective ALUs within the execution lane array; and, 3) a memory instruction 353 that is broadcasted and executed in a partial SIMD fashion (e.g., if execution lanes along a same row in the execution lane array share a same random access memory, then one execution lane from each of the different rows actually execute the instruction (the format of the memory instruction 353 may include an operand that identifies which execution lane from each row executes the instruction)).

A field 354 for one or more immediate operands is also included. Which of the instructions 351, 352, 353 use which immediate operand information may be identified in the instruction format. Each of instructions 351, 352, 353 also includes its own respective input operand and resultant information (e.g., local registers for ALU operations and a local register and a memory address for memory access instructions). In an embodiment, the scalar instruction 351 is executed by the scalar processor before the execution lanes within the execution lane array execute either of the other two instructions 352, 353. That is, the execution of the VLIW word includes a first cycle upon which the scalar instruction 351 is executed followed by a second cycle upon with the other instructions 352, 353 may be executed (note that in various embodiments instructions 352 and 353 may be executed in parallel).

In an embodiment, the scalar instructions executed by the scalar processor 302 include commands issued to the sheet generator 103 to load/store sheets from/into the memories or 2D shift register 306 of the data computation unit 301. Here, the sheet generator's operation can be dependent on the operation of the line buffer unit 101 or other variables that prevent pre-runtime comprehension of the number of cycles it will take the sheet generator 103 to complete any command issued by the scalar processor 302. As such, in an embodiment, any VLIW word whose scalar instruction 351 corresponds to or otherwise causes a command to be issued to the sheet generator 103 also includes no-operation (NOOP) instructions in the other two instruction fields 352, 353. The program code then enters a loop of NOOP instructions for instruction fields 352, 353 until the sheet generator completes its load/store to/from the data computation unit. Here, upon issuing a command to the sheet generator, the scalar processor may set a bit of an interlock register that the sheet generator resets upon completion of the command. During the NOOP loop the scalar processor monitors the bit of the interlock bit. When the scalar processor detects that the sheet generator has completed its command normal execution begins again.

Figure 4:
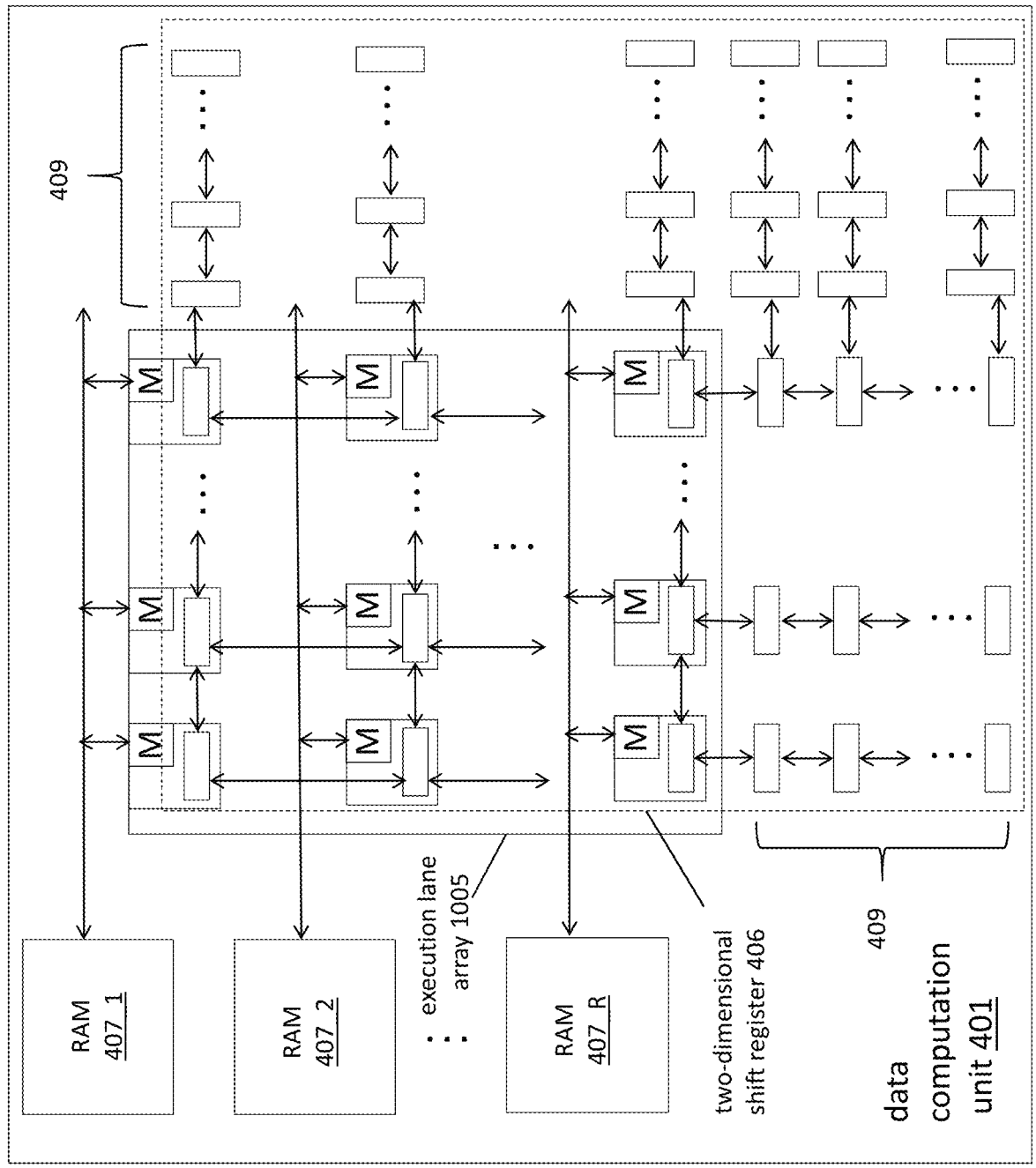
FIG. 4 shows an embodiment of a data computation unit within a stencil processor.

FIG. 4 shows an embodiment of a data computation unit 401. As observed in FIG. 4, the data computation unit 401 includes an array of execution lanes 405 that are logically positioned "above" a two-dimensional shift register array structure 406. As discussed above, in various embodiments, a sheet of image data provided by a sheet generator is loaded into the two-dimensional shift register 406. The execution lanes then operate on the sheet data from the register structure 406.

The execution lane array 405 and shift register structure 406 are fixed in position relative to one another. However, the data within the shift register array 406 shifts in a strategic and coordinated fashion to cause each execution lane in the execution lane array to process a different stencil within the data. As such, each execution lane determines the output image value for a different pixel in the output sheet being generated. From the architecture of FIG. 4 it should be clear that overlapping stencils are not only arranged vertically but also horizontally as the execution lane array 405 includes vertically adjacent execution lanes as well as horizontally adjacent execution lanes.

Some notable architectural features of the data computation unit 401 include the shift register structure 406 having wider dimensions than the execution lane array 405. That is, there is a "halo" of registers 409 outside the execution lane array 405. Although the halo 409 is shown to exist on two sides of the execution lane array, depending on implementation, the halo may exist on less (one) or more (three or four) sides of the execution lane array 405. The halo 405 serves to provide "spill-over" space for data that spills outside the bounds of the execution lane array 405 as the data is shifting "beneath" the execution lanes 405. As a simple case, a 5×5 stencil centered on the right edge of the execution lane array 405 will need four halo register locations further to the right when the stencil's leftmost pixels are processed. For ease of drawing, FIG. 4 shows the registers of the right side of the halo as only having horizontal shift connections and registers of the bottom side of the halo as only having vertical shift connections when, in a nominal embodiment, registers on either side (right, bottom) would have both horizontal and vertical connections.

Additional spill-over room is provided by random access memories 407 that are coupled to each row and/or each column in the array, or portions thereof (e.g., a random access memory may be assigned to a "region" of the execution lane array that spans 4 execution lanes row wise and 2 execution lanes column wise. For simplicity the remainder of the application will refer mainly to row and/or column based allocation schemes). Here, if an execution lane's kernel operations require it to process pixel values outside of the two-dimensional shift register array 406 (which some image processing routines may require) the plane of image data is able to further spill-over, e.g., from the halo region 409 into random access memory 407. For example, consider a 6×6 stencil where the hardware includes a halo region of only four storage elements to the right of an execution lane on the right edge of the execution lane array. In this case, the data would need to be shifted further to the right off the right edge of the halo 409 to fully process the stencil. Data that is shifted outside the halo region 409 would then spill over to random access memory 407. Other applications of the random access memories 407 and the stencil processor of FIG. 3 are provided further below.

FIGS. 5a through 5k demonstrate a working example of the manner in which image data is shifted within the two-dimensional shift register array "beneath" the execution lane array as alluded to above. As observed in FIG. 5a, the data contents of the two-dimensional shift array are depicted in a first array 507 and the execution lane array is depicted by a frame 505. Also, two neighboring execution lanes 510 within the execution lane array are simplistically depicted. In this simplistic depiction 510, each execution lane includes a register R1 that can accept data from the shift register, accept data from an ALU output (e.g., to behave as an accumulator across cycles), or write output data into an output destination.

Each execution lane also has available, in a local register R2, the contents "beneath" it in the two-dimensional shift array. Thus, R1 is a physical register of the execution lane while R2 is a physical register of the two-dimensional shift register array. The execution lane includes an ALU that can operate on operands provided by R1 and/or R2. As will be described in more detail further below, in an embodiment the shift register is actually implemented with multiple (a "depth" of) storage/register elements per array location but the shifting activity is limited to one plane of storage elements (e.g., only one plane of storage elements can shift per cycle). FIGS. 5a through 5k depict one of these deeper register locations as being used to store the resultant X from the respective execution lanes. For illustrative ease the deeper resultant register is drawn alongside rather than beneath its counterpart register R2.

FIGS. 5a through 5k focus on the calculation of two stencils whose central position is aligned with the pair of execution lane positions 511 depicted within the execution lane array 505. For ease of illustration, the pair of execution lanes 510 are drawn as horizontal neighbors when in fact, according to the following example, they are vertical neighbors.

Figure 5B:
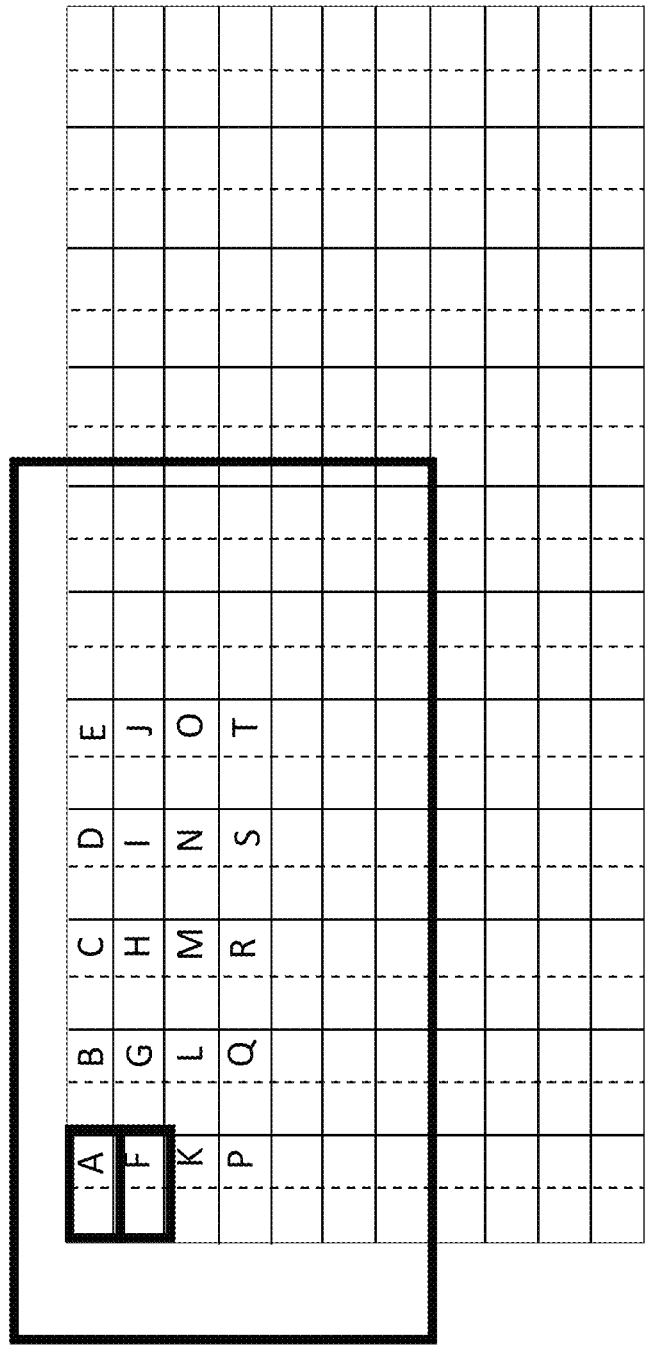

As observed initially in FIG. 5a, the execution lanes 511 are centered on their central stencil locations. FIG. 5b shows the object code executed by both execution lanes 511. As observed in FIG. 11b the program code of both execution lanes 511 causes the data within the shift register array 507 to shift down one position and shift right one position. This aligns both execution lanes 511 to the upper left hand corner of their respective stencils. The program code then causes the data that is located (in R2) in their respective locations to be loaded into R1.

Figure 5C:
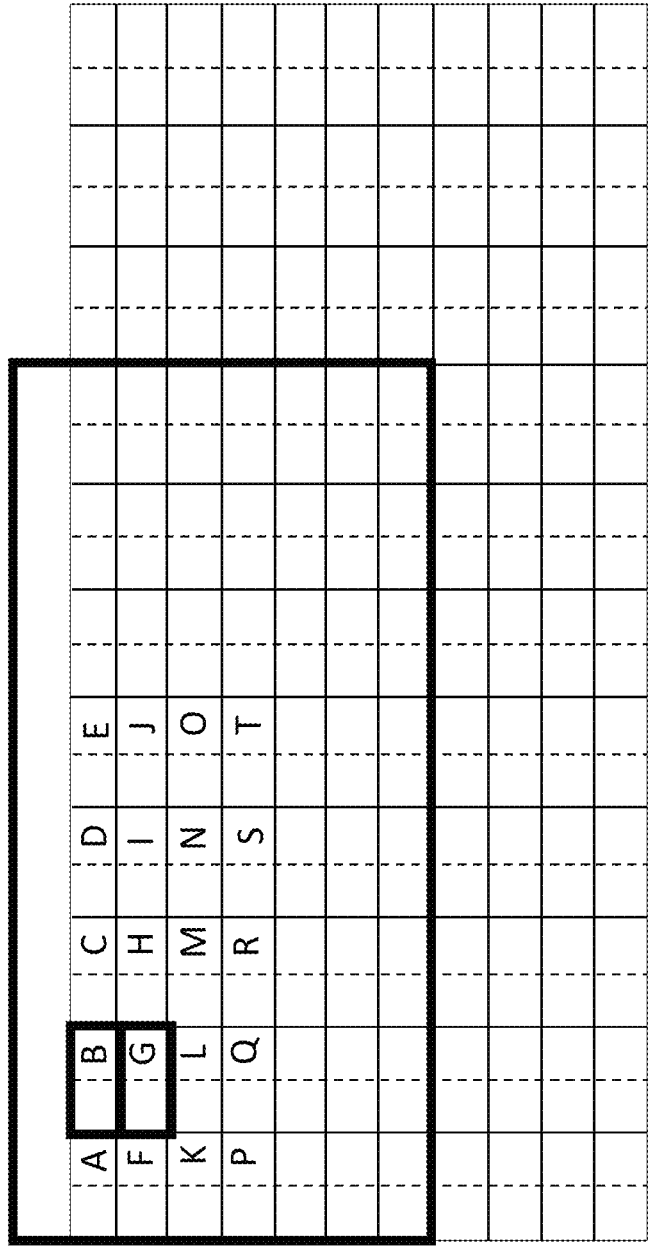
Figure 5D:
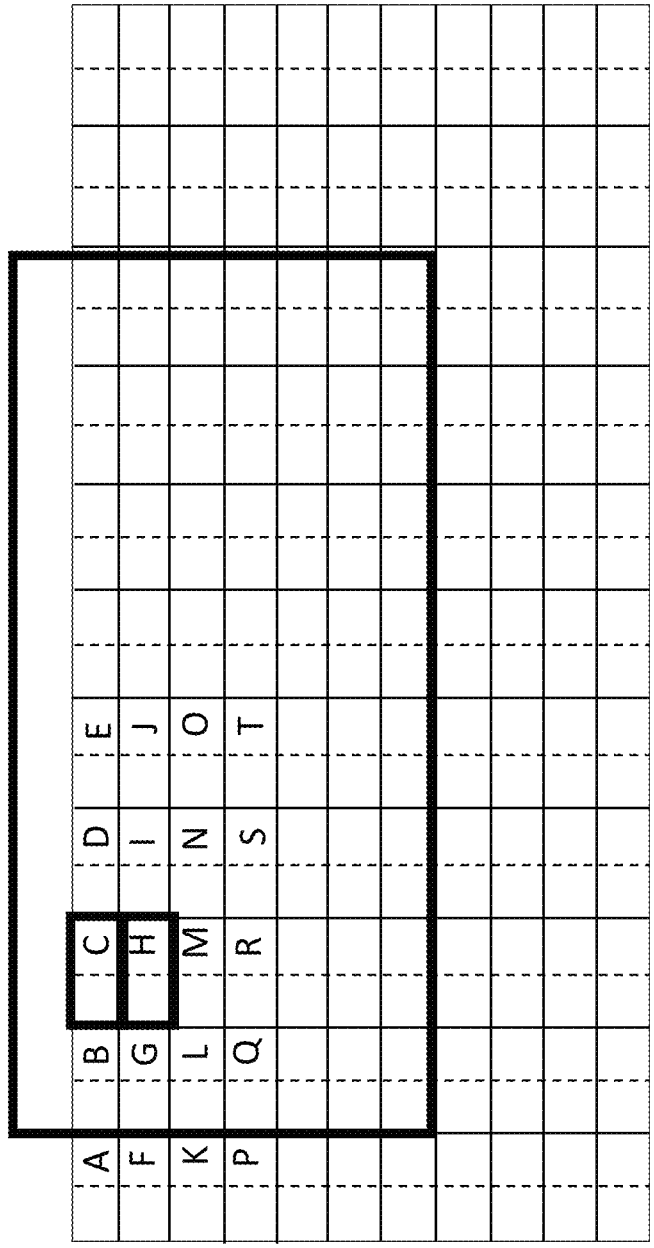

As observed in FIG. 5c the program code next causes the pair of execution lanes 511 to shift the data within the shift register array 507 one unit to the left which causes the value to the right of each execution lane's respective position to be shifted into each execution lane'position. The value in R1 (previous value) is then added with the new value that has shifted into the execution lane's position (in R2). The resultant is written into R1. As observed in FIG. 5d the same process as described above for FIG. 5c is repeated which causes the resultant R1 to now include the value A+B+C in the upper execution lane and F+G+H in the lower execution lane. At this point both execution lanes 511 have processed the upper row of their respective stencils. Note the spill-over into a halo region on the left side of the execution lane array 505 (if one exists on the left hand side) or into random access memory if a halo region does not exist on the left hand side of the execution lane array 505.

Figure 5E:
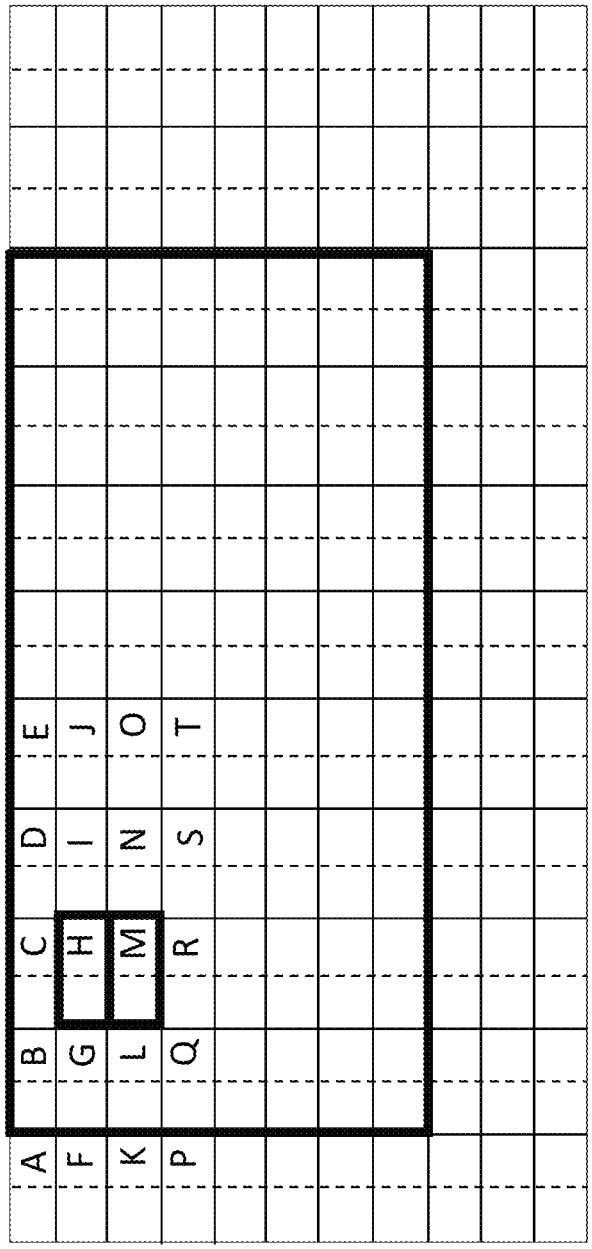
Figure 5F:
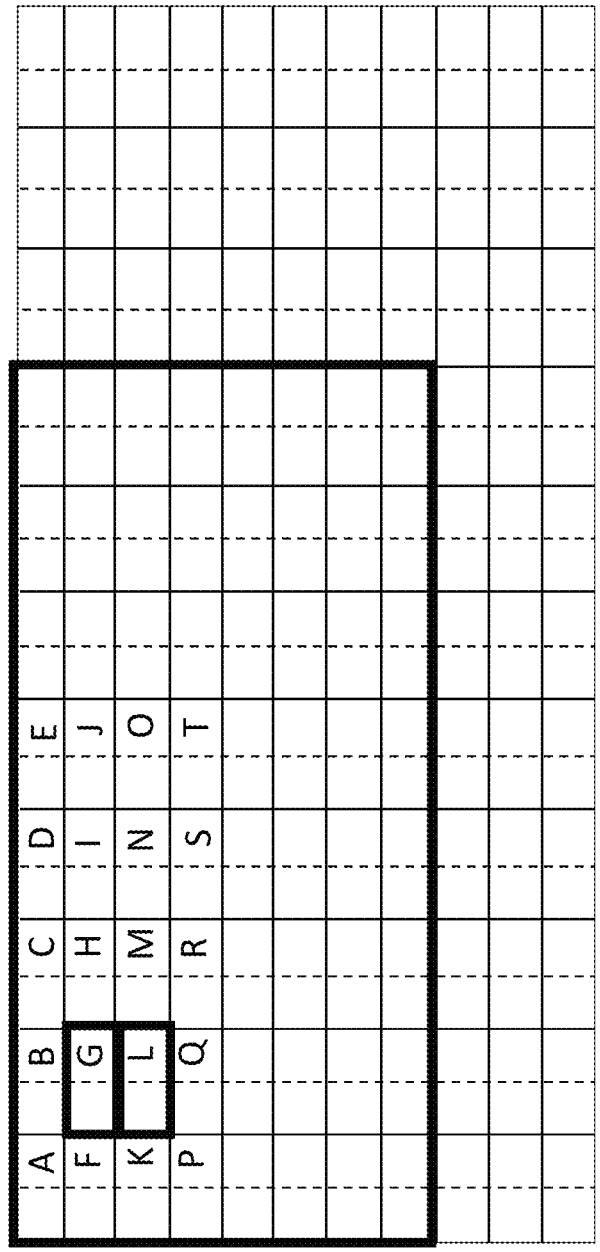
Figure 5G:
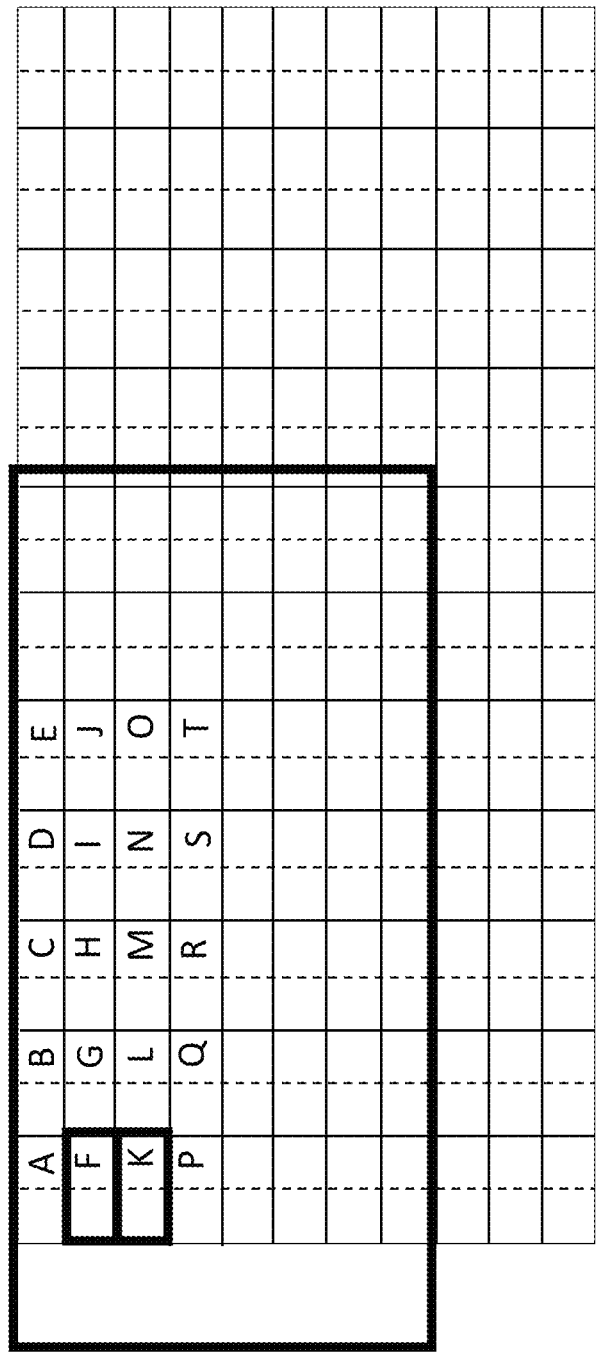

As observed in FIG. 5e, the program code next causes the data within the shift register array to shift one unit up which causes both execution lanes 511 to be aligned with the right edge of the middle row of their respective stencils. Register R1 of both execution lanes 511 currently includes the summation of the stencil's top row and the middle row's rightmost value. FIGS. 5f and 5g demonstrate continued progress moving leftwise across the middle row of both execution lane's stencils. The accumulative addition continues such that at the end of processing of FIG. 5g both execution lanes 511 include the summation of the values of the top row and the middle row of their respective stencils.

Figure 5H:
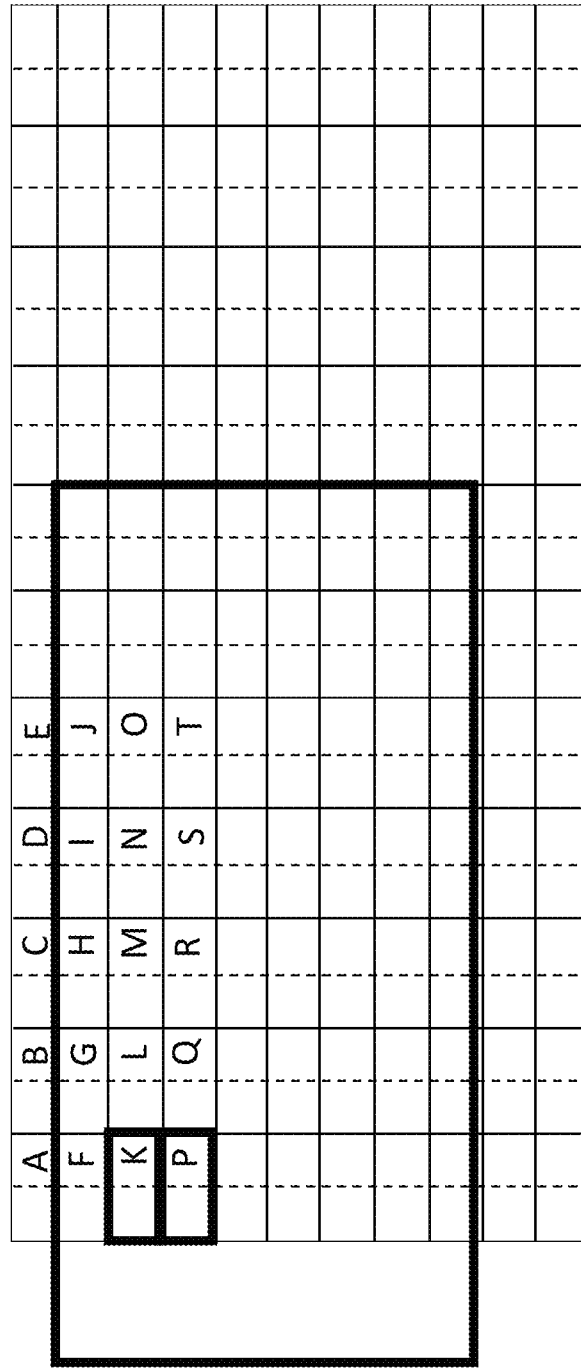
Figure 5I:
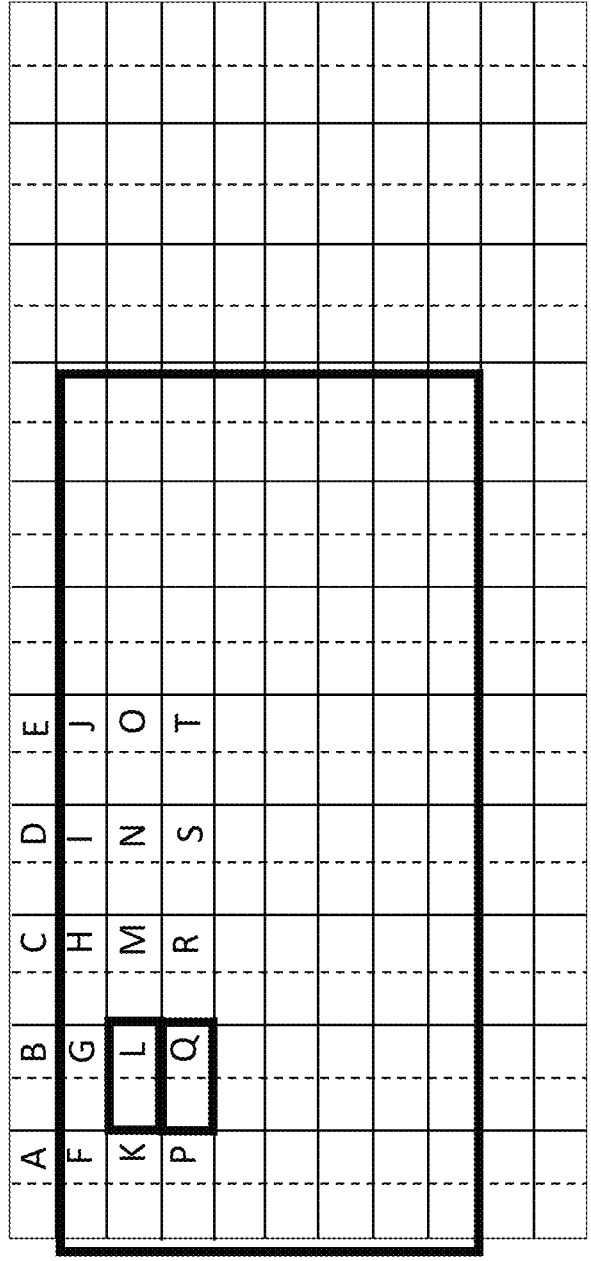
Figure 5J:
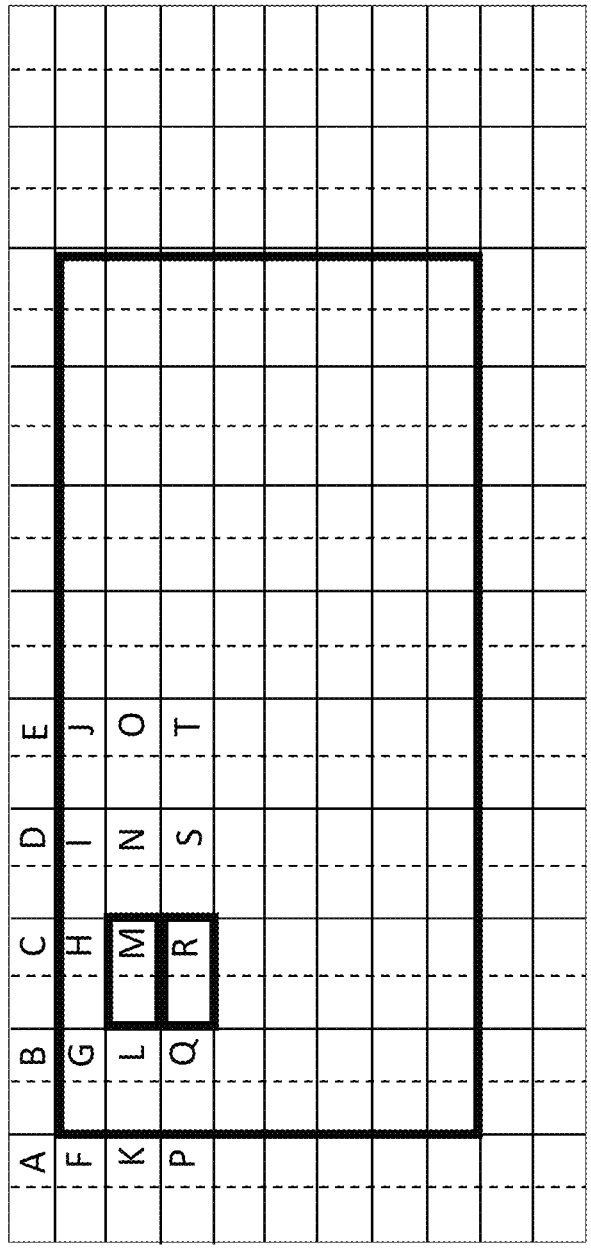
Figure 5K:
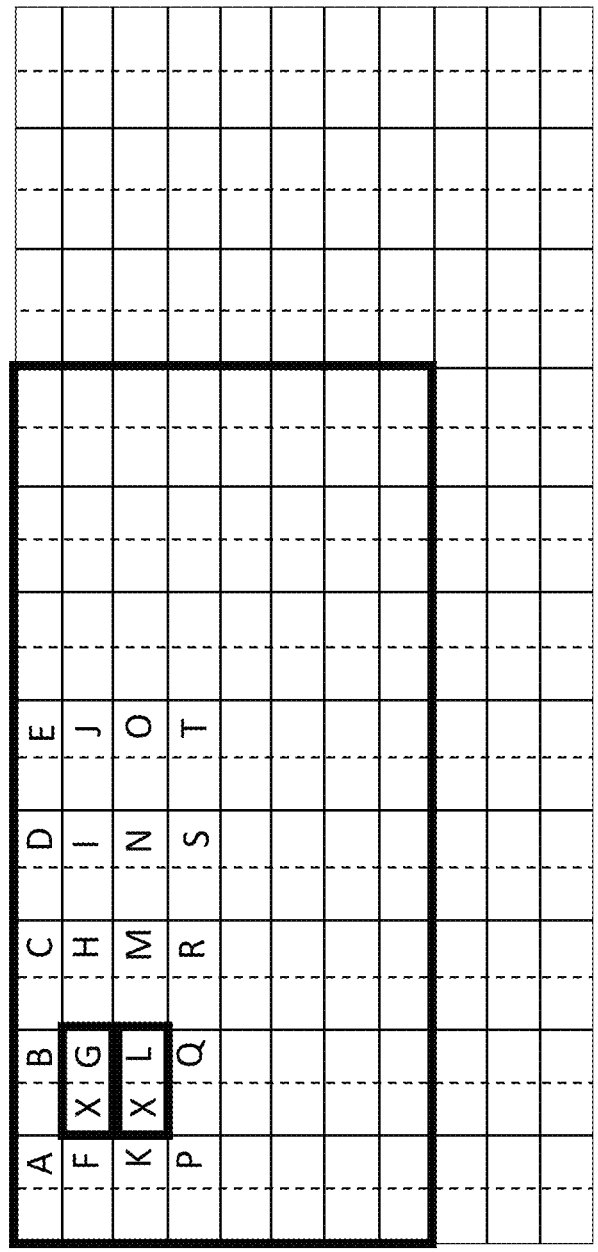

FIG. 5h shows another shift to align each execution lane with its corresponding stencil's lowest row. FIGS. 5i and 5j show continued shifting to complete processing over the course of both execution lanes' stencils. FIG. 5k shows additional shifting to align each execution lane with its correct position in the data array and write the resultant thereto.

In the example of FIGS. 5a-5k note that the object code for the shift operations may include an instruction format that identifies the direction and magnitude of the shift expressed in (X, Y) coordinates. For example, the object code for a shift up by one location may be expressed in object code as SHIFT 0, +1. As another example, a shift to the right by one location may be expressed in object code as SHIFT +1, 0. In various embodiments shifts of larger magnitude may also be specified in object code (e.g., SHIFT 0, +2). Here, if the 2D shift register hardware only supports shifts by one location per cycle, the instruction may be interpreted by the machine to require multiple cycle execution, or, the 2D shift register hardware may be designed to support shifts by more than one location per cycle. Embodiments of the later are described in more detail further below.

Figure 6A:
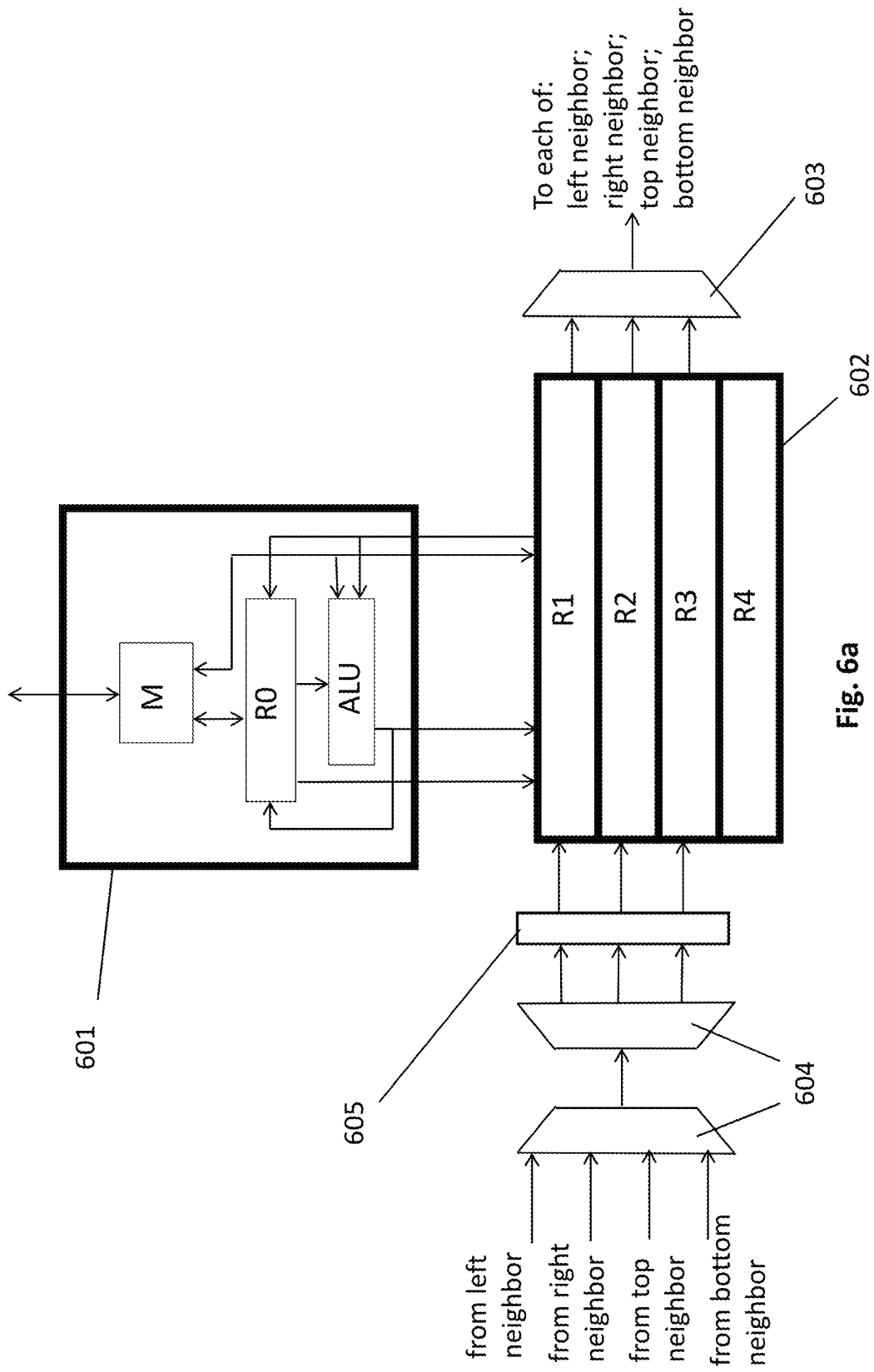
FIG. 6a shows an embodiment of a unit cell for an integrated execution lane array and two-dimensional shift array that supports masked shift instructions.

FIG. 6a shows another, more detailed depiction of the unit cell for the array execution lane and shift register structure (registers in the halo region do not include a corresponding execution lane). The execution lane and the register space that is associated with each location in the execution lane array is, in an embodiment, implemented by instantiating the circuitry observed in FIG. 6a at each node of the execution lane array. As observed in FIG. 6a, the unit cell includes an execution lane 601 coupled to a register file 602 consisting of four registers R1 through R4. During any cycle, the execution lane 601 may read from or write to any of registers R1 through R4. For instructions requiring two input operands the execution lane may retrieve both of operands from any of R1 through R4.

In an embodiment, the two dimensional shift register structure is implemented by permitting, during a single cycle, the contents of any of (only) one of registers R1 through R3 to be shifted "out" to one of its neighbor's register files through output multiplexer 603, and, having the contents of any of (only) one of registers R1 through R3 replaced with content that is shifted "in" from a corresponding one if its neighbors through input multiplexers 604 such that shifts between neighbors are in a same direction (e.g., all execution lanes shift left, all execution lanes shift right, etc.). Although it may be common for a same register to have its contents shifted out and replaced with content that is shifted in on a same cycle, the multiplexer arrangement 603, 604 permits for different shift source and shift target registers within a same register file during a same cycle.

As depicted in FIG. 6a note that during a shift sequence an execution lane will shift content out from its register file 602 to each of its left, right, top, and bottom neighbors. In conjunction with the same shift sequence, the execution lane will also shift content into its register file from a particular one of its left, right, top, and bottom neighbors. Again, the shift out target and shift in source should be consistent with a same shift direction for all execution lanes (e.g., if the shift out is to the right neighbor, the shift in should be from the left neighbor). For simplicity FIG. 6a only shows nearest neighbor inputs/outputs for nearest neighbor shifts. For shifts of more than one array location (e.g., 2, 4, 8, etc.), additional inputs/outputs may flow from/to such source/destination array locations with respect to the unit cell.

Although in one embodiment the content of only one register is permitted to be shifted per execution lane per cycle, other embodiments may permit the content of more than one register to be shifted in/out. For example, the content of two registers may be shifted out/in during a same cycle if a second instance of the multiplexer circuitry 603, 604 observed in FIG. 6a is incorporated into the design of FIG. 6a. Of course, in embodiments where the content of only one register is permitted to be shifted per cycle, shifts from multiple registers may take place between mathematical operations by consuming more clock cycles for shifts between mathematical operations (e.g., the contents of two registers may be shifted between math ops by consuming two shift ops between the math ops).

If less than all the content of an execution lane's register files are shifted out during a shift sequence note that the content of the non shifted out registers of each execution lane remain in place (do not shift). As such, any non-shifted content that is not replaced with shifted-in content persists local to the execution lane across the shifting cycle. The memory unit ("M") observed in each execution lane is used to load/store data from/to the random access memory space that is associated with the execution lane's row and/or column within the execution lane array. Here, the M unit acts as a standard M unit in that it is often used to load/store data that cannot be loaded/stored from/to the execution lane's own register space. In various embodiments, the primary operation of the M unit is to write data from a local register into memory, and, read data from memory and write it into a local register.

With respect to the instruction set architecture (ISA) opcodes supported by the ALU unit of the hardware execution lane 601, in various embodiments, the mathematical opcodes supported by the hardware ALU are integrally tied with (e.g., substantially the same as) the mathematical opcodes supported by a virtual execution lane (e.g., ADD, SUB, MOV, MUL, MAD, ABS, DIV, SHL, SHR, MIN/MAX, SEL, AND, OR, XOR, NOT). As described just above, memory access instructions can be executed by the execution lane 601 to fetch/store data from/to their associated random access memory. Additionally the hardware execution lane 601 supports shift operation instructions (right, left, up, down) to shift data within the two-dimensional shift register structure. As described above, program control instructions are largely executed by the scalar processor of the stencil processor.

2.0 Masked Shift Instruction Operations

Referring to FIG. 6a, note the presence of masking logic circuit 605. As described at length below, masking logic circuitry 605 is used for masking out (or not masking out) data that is shifted to the unit cell's register space 602 from another location in the two dimensional shift register array. Here, a data item that is shifted to the unit cell's register space 602 from another location of the two dimensional shift register array will or will not be written into the register space 602 depending on a mask operand that is included in the instruction format of the shift instruction that is being executed by the execution lane array and that caused the data item to be shifted to the unit cell 600.

As such, in view of the mask operand that is embedded in the shift instruction, the respective masking logic circuit 605 of a first set of locations within the array will write shifted data to its local register space while a second set of different locations within the array will not write shifted data to its local register space. That is, the mask operand that is integrated into the shift instruction essentially tells the machine which array locations are to write its shifted data and which array locations are not to write its shifted data. The ability to define which array locations write shifted information and which array locations do not write shifted information during execution of a same shift instruction provides for the implementation of "shift write patterns" within the array that are very useful for efficiently realizing fundamental image processing related data operations.

Figure 6B:
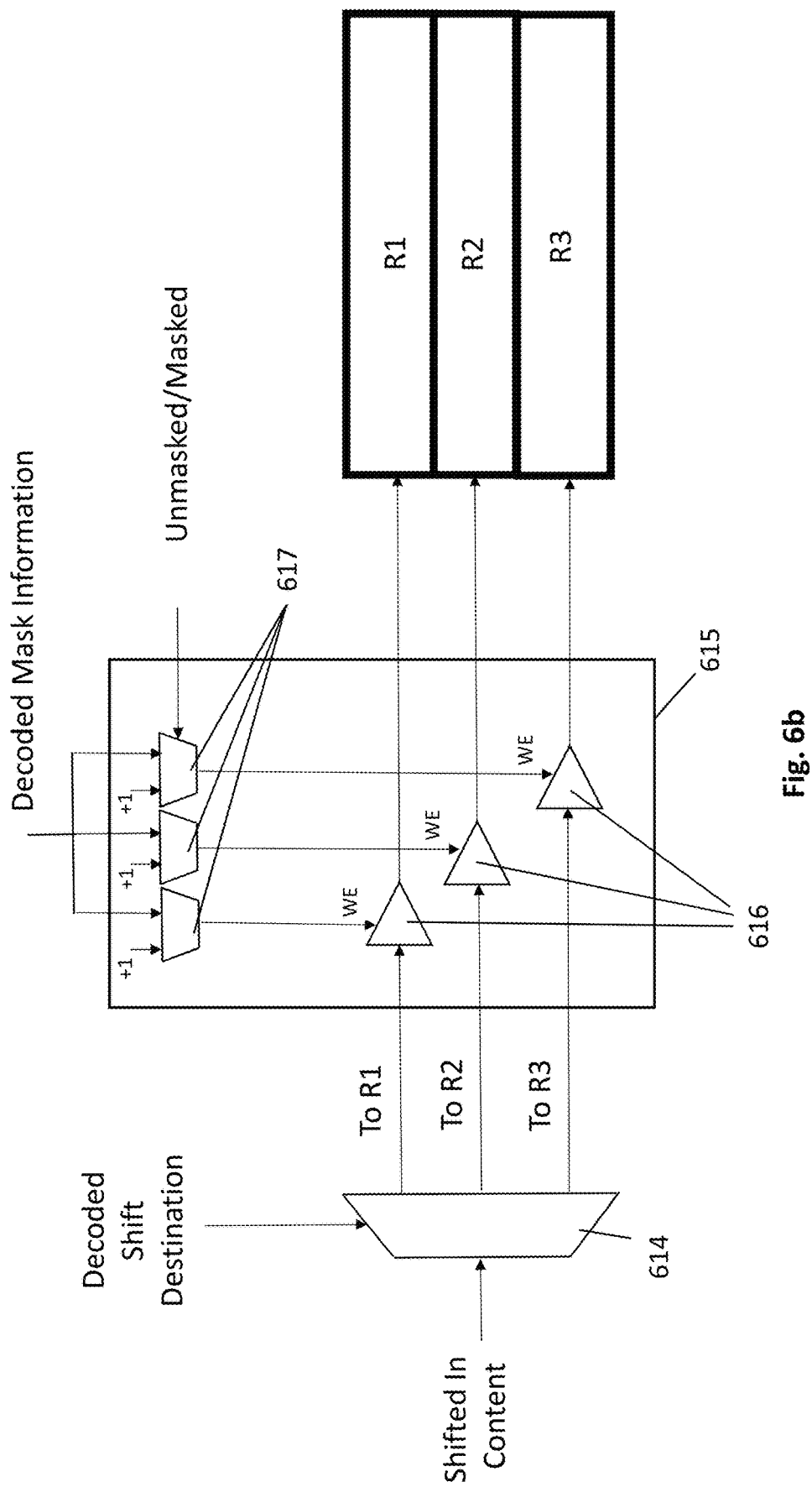

FIG. 6b shows a more detailed embodiment 615 of the masking logic circuitry 605 of FIG. 6a. Here, which one of the registers (R1, R2 or R3) within the unit cell is to be written to is determined by demultiplexer 614. The channel select input of demultiplexer 614, which directs shifted in content to the correct register location within the unit cell, is determined from the decoded shift instruction irrespective of whether the shift instruction is a masked shift instruction or not a masked shift instruction (both unmasked and masked shift instructions specify a destination register that determines the channel selection of demultiplexer 614).

The masking logic circuitry 614 includes a bank of buffers 616 (one buffer for each register destination) and a bank of multiplexers 617 that set the respective write enable (WE) for each of the buffers 615. The channel select for each multiplexer in the bank of multiplexers 617 is dependent on whether the shift instruction is a regular (unmasked) or masked shift instruction. If the shift instruction is an unmasked shift instruction, a first channel is selected for each of the multiplexers 617 that provides a logical true write enable signal (1) to each of the buffers 616. In this case, each of the buffers 616 is enabled and the shifted-in content is written into which ever of the register levels is specified as the destination by the instruction.

By contrast, if the shift instruction is a masked shift instruction, the multiplexers 617 select an alternate channel that receives decoded mask information. Here, as discussed above, mask information is included in a masked shift instruction that informs each unit cell whether or not it is to write its shifted in content into its register space. Thus, if the decoded mask information indicates that the particular unit cell is to write its shifted in content, the decoded mask information is a logical true (1) for that unit cell, which, in turn, enables the buffers 616. The enabling of the buffers 616 permits the shifted in content to be written to its particular destination register. By contrast, if the decoded mask information indicates that the particular unit cell is not to write its shifted in content, (e.g., decoded mask information=logical not true=0), the buffers 616 are disabled which prevents the shifted in content from being written into any of the registers.

For simplicity, the decoding circuits that decode the shift instructions are not shown although in various embodiments such circuitry is associated with each execution lane array location, or, is integrated in centralized instruction issue circuitry that issues decoded instruction words to the execution lanes. However, in various embodiments, each unit cell's execution lane includes custom or semi-custom masking information decoding circuitry that uniquely determines the correct decoded mask information for its particular unit cell location based on the masking information of the instruction. The custom/semi-custom masked information decoding may be appropriate given that, as will be clear from the following discussion, in various embodiments, masking information is provided as a code that uniquely specifies a pattern as to which array lanes are to be masked and which array lanes are not to be masked, and, each array location must determine its particular masking bit from the code.

In other embodiments, the masking information in the instruction may not be encoded (e.g., a bit is reserved in an operand that dictates masking behavior for a particular row or column in the array). In this case, the raw operand bit is provided to the multiplexers 617 directly.

a. Extended Halo Emulation

FIG. 7 shows another depiction of the two dimensional shift register array 701.

Recall from preceding discussions that in various embodiments the two dimensional shift register array 701 includes a halo region 703 that holds extra data content that is needed to execute over two-dimensional stencils of data that are centered on the locations of the execution lane array 702 that reside at/near the edges of the execution lane array 702. For instance, to process over stencils having dimensions of 3 pixels by 3 pixels (3×3 pixels), the execution lane array locations that reside along the rightmost edge of the execution lane array 702 will need pixel data from array locations to the right "off the right edge" of the execution lane array 702. The halo region 703 is used to hold such data. The halo region 703 also includes a bottom region to provide data needed by execution lane array locations that are at/near the bottom edge of the execution lane array 702.

Features 706 of FIG. 7 indicate that in various embodiments the two dimensional shift register 701 is designed to "roll" such that data that is shifted off the left hand side of the two dimensional shift register array 701 will appear in order on the right hand side of the halo region 703. Likewise, data that is shifted off the right hand side of the halo region 703 will reappear in order on the left hand side of the two dimensional shift register array 701. Similar rolling can also be made to happen vertically with respect to the top and bottom edges of the two dimensional shift register array 701.

An issue is the ability to support large stencil sizes that result in needed data for the array locations that reside at/near the right/bottom edges of the execution lane array 702 being located outside the halo region 703. That is, needed data resides off the right hand edge of the halo region and/or off the bottom edge of the halo region 703.

Figure 8A:
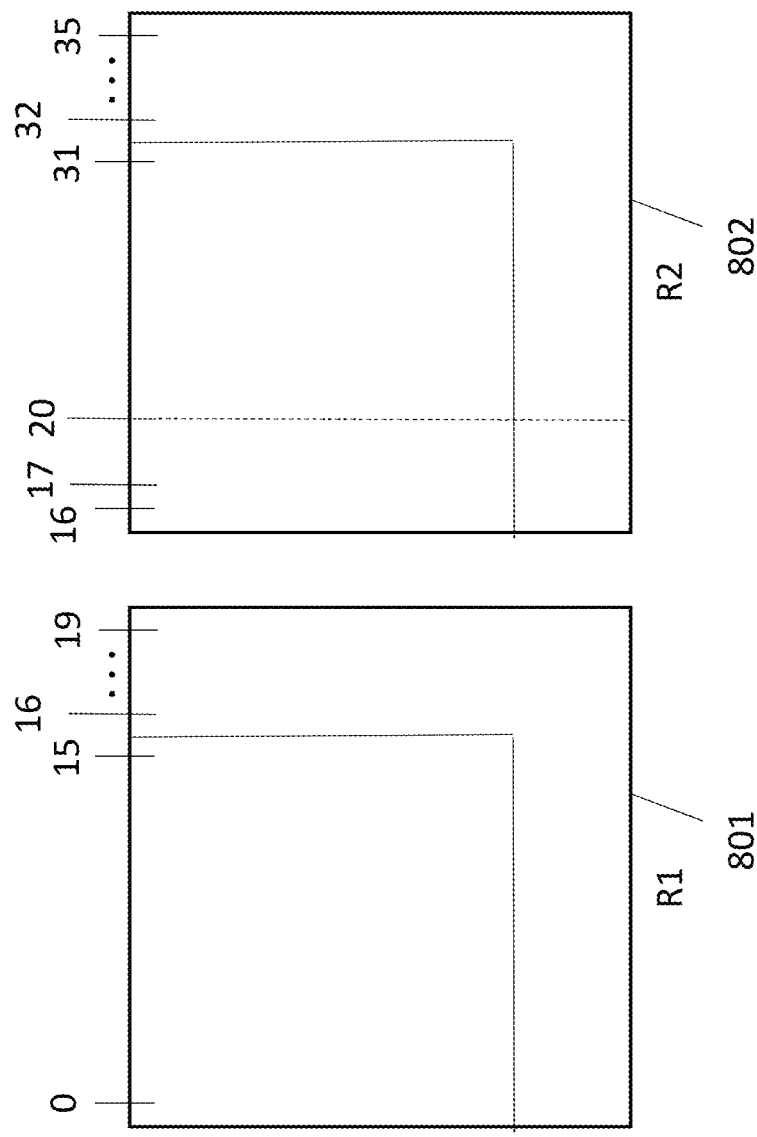
FIGS. 8a, 8b, 8c and 8d show a process for emulating an extended halo region using a masked shift instruction.

FIGS. 8a through 8d depict a mechanism for emulating additional halo region space using the multiple register levels of the two dimensional register and a masked shift instruction that implements a specific write pattern as discussed above. Here, as observed in FIG. 8a, a first tile 801 of image data consumes the R1 level of register space of the execution lane array and the halo region. Here, the execution lane array is assumed to have a dimension of 16×16 pixels and the halo region is assumed to add four extra pixel locations around the right and bottom periphery of the execution lane array. As such, the first tile 801 has a dimension of 20×20 pixels. More specifically, as depicted in FIG. 8a, the image data of tile 801 includes columns 0 through 15 of image space which consume the execution lane array and the bottom portion of the halo region beneath the execution lane array. The image data of tile 801 also includes columns 16 through 19 of image space which consumes the right hand portion of the halo.

FIG. 8a also shows the existence of a second, neighboring tile of image data 802 in image space that consumes the R2 level of within the two dimensional shift register array. Here, the second tile 802 includes columns 16 through 35 of image space. The abutment of the second tile 802 to the right of the first tile 801 in image space is aligned with respect to the execution lane array (the halo region of the first tile 801 is not considered in the abutment). As such, the first column of the second tile 802 corresponds to column 16 in image space because the column of the first tile 801 that aligns with the rightmost edge of the execution lane array is column 15 in image space.

In an embodiment, a compiler that is compiling program code for execution on the image processor recognizes that the stencil size being computed over will extend beyond the halo region in hardware and, in response, creates the image data structures 801, 802 of FIG. 8a in the two dimensional shift register array as a precondition prior to execution of the larger stencils on the image data in the first tile 801 that is aligned with the execution lane array (columns 0 through 15 in image space in FIG. 8a).

During runtime execution, the program code creates the tiles 801, 802 in the two dimensional shift register space and begins processing the image data that is aligned with the execution lane array of the first tile (columns 0 through 15 in image space) with the larger kernel size. Eventually, the processing will consume all the data in the first tile 801 and, because of the larger stencil size, will need data in the second tile 802. For the sake of simplicity, assume that the stencil size has a width of 6 pixels and therefore only one column of pixel data in tile 802 is needed (column 20 in image space) to complete stencil processing for the pixels that are currently being processed in the execution lane array (columns 0 through 15 in image space). That is, for a halo width of 4 pixels and a stencil width of 6 pixels, the farthest rightmost reach of the stencil will be column 20 in image space for the pixel locations that run along the rightmost edge of the execution lane array.

Figure 8B:
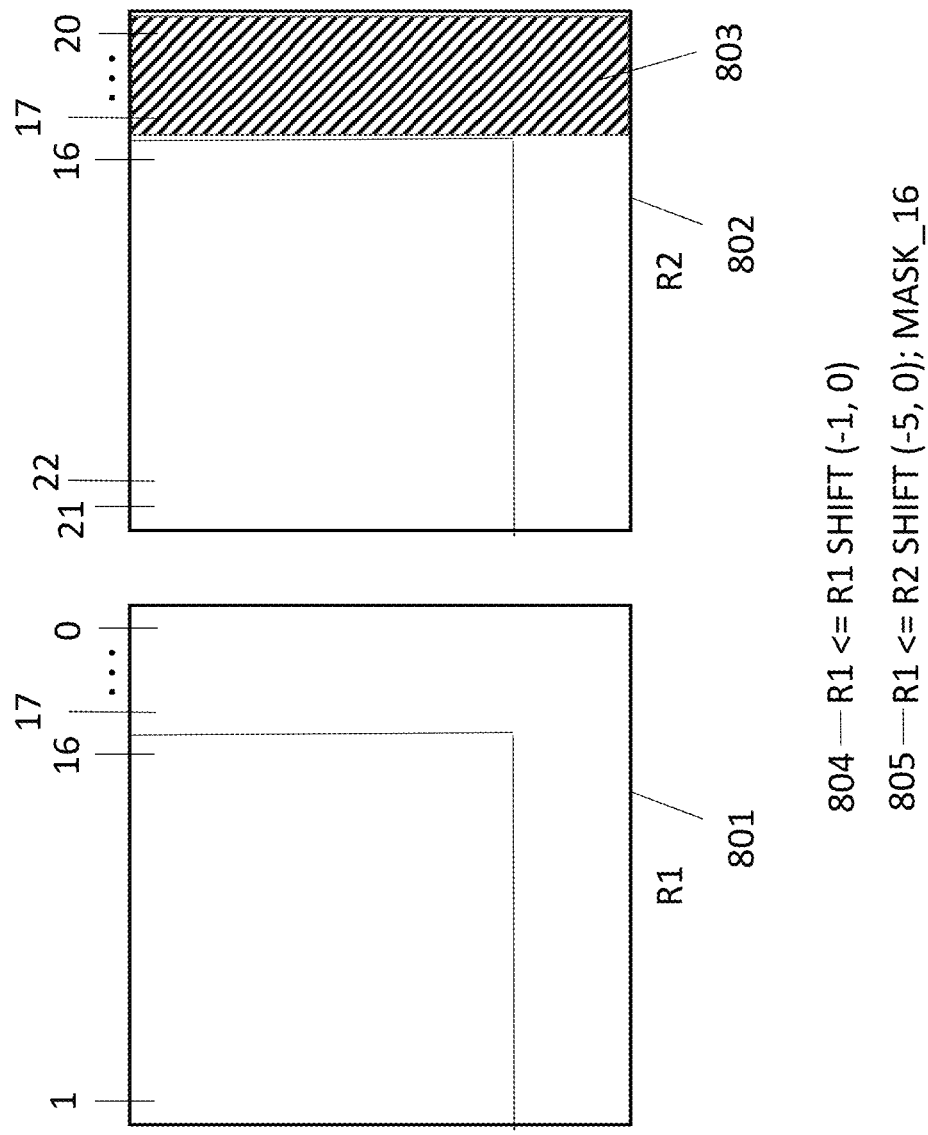
Figure 8C:
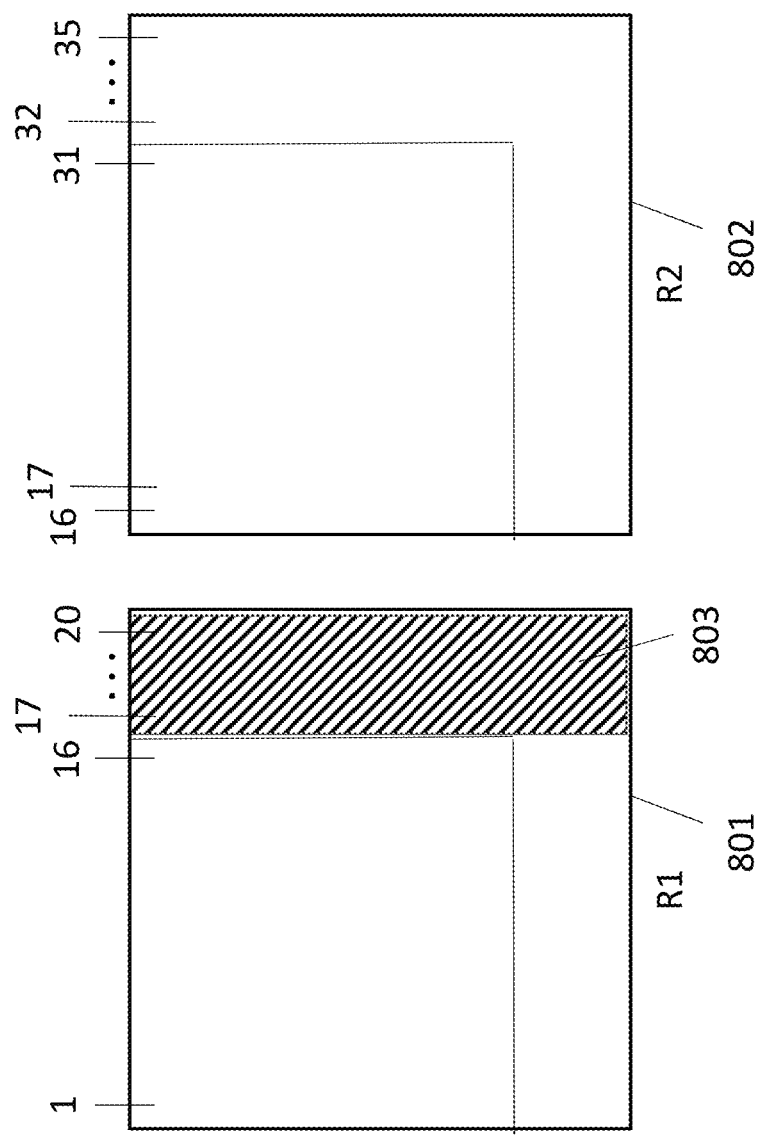
Figure 8D:
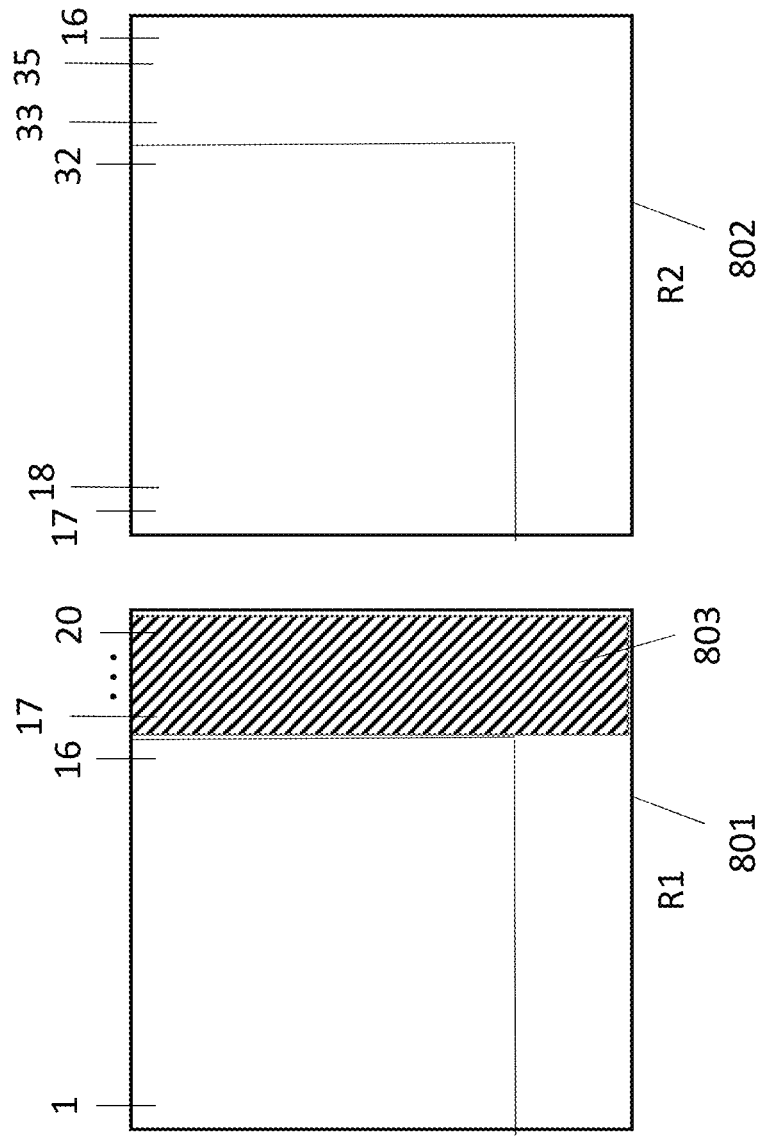

FIGS. 8b through 8d show some low overhead data movements including a masked shift instruction to bring the needed data into the halo region of the physical hardware. As observed in FIG. 8b, a first shift instruction 804 shifts the content of the first tile 801 in the R1 level to the left by an amount that is equal to the amount of data that is needed from the second tile (in this example, 1) and a second masked shift instruction 805 that shifts the content of tile 802 in the R2 level to the left by an amount equal to the halo width (4) plus the amount of new data that is needed from tile 802 (1) which, in this example, corresponds to a left shift of 5. Additionally, the masked shift instruction 805 writes the shifted content of tile 802 in R2 into R1 (rather than R2) and uses a special mask pattern than only writes the shifted data to the halo region. Here, the mask operand for the special mask pattern is given a nomenclature of MASK_16 which is interpreted by the machine to not write to the first 16 columns of the two dimensional shift register array (which essentially avoids writing to the execution lane array), leaving only the right portion of the halo region to be written to.

FIG. 8b shows the content of the first and second tiles 801, 802 after the shifting activity of both instructions 804, 805 but does not show the completed writing activity of the second masked shift instruction 805. FIG. 8c shows the resulting data structure in R1 after the writing of the masked shift instruction is complete. Referring to FIGS. 8b and 8c, the shaded content 803 of tile 802 in R2 of FIG. 8b (the last four columns, consistent with the mask operand informing the machine to ignore the first sixteen columns) is written as the shaded content 803 of tile 801 in R1 of FIG. 8c. Comparing the halo region content of FIG. 8a with the halo region content of FIG. 8c, note that the needed column 20 in image space is located in the physical halo region after the writing activity of the masked shift instruction 805 as depicted in FIG. 8c. Thus, through the data movements of FIGS. 8b and 8c, the right side of the halo region has been emulated to have a width of five pixels instead of being limited to the physical/hardware limit of four pixels. A final shift left by one is performed to the content in tile 802 in R2 to align the leftmost data in tile 802 with the rightmost data along the right edge of the execution lane array in tile 801.

The above processing algorithm can be extended to emulate halo regions that at least double the effective size of the halo region. That is, for the exemplary hardware platform of the present example, the algorithm described above can be used to fetch any of one, two, three of four extra pixels from tile 802. Here, more generally, the algorithm includes shifting the first tile whose data is being processed over by the amount of needed data and using a masked shift instruction on the second tile that shifts the second tile by the physical halo width plus the amount of extra data needed and writing the shifted content over the first tile only within the halo region. Note that a same/similar algorithm can also be applied vertically to obtain extra data beneath the bottom edge of the halo region (the example of FIGS. 8a through 8d is a horizontal application of the algorithm).

b. Compaction

FIGS. 9a through 9e show another set of data movements that use masked shift instructions to reduce the footprint size of image data. Here, as is understood in the art, image data is made smaller through "down-sampling" which removes some of the pixels but keeps others of the pixels. In the example of FIGS. 9a through 9e, the image size is cut in half by only keeping the odd columns and correctly aligning them against the left hand edge of the execution lane array.

Figure 9A:
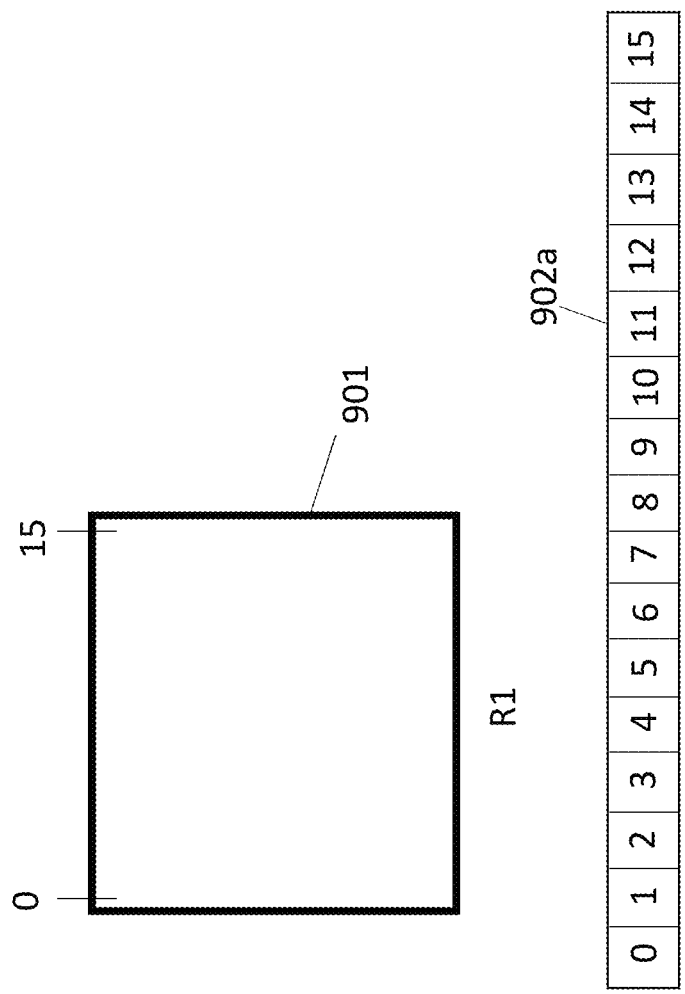
FIGS. 9a, 9b, 9c, 9d and 9e show a process for compacting image data using masked shift instructions.

FIG. 9a shows a depiction of the initial state prior to execution of the algorithm. Here, assume the image data to be compacted is contained in the R1 level of the two dimensional shift register array. For simplicity only the execution lane array area 901 is depicted. Also, for ease of drawing, the register content is identified by column numbers in register space 902a. Here, as with the halo extension emulation example of the preceding section, the R1 content of the two dimensional shift register contains columns 0 through 15 of image space which consume the area of the execution lane array. For simplicity the halo region is ignored (a comment about this simplification is provided at the end of the discussion).

Figure 9B:
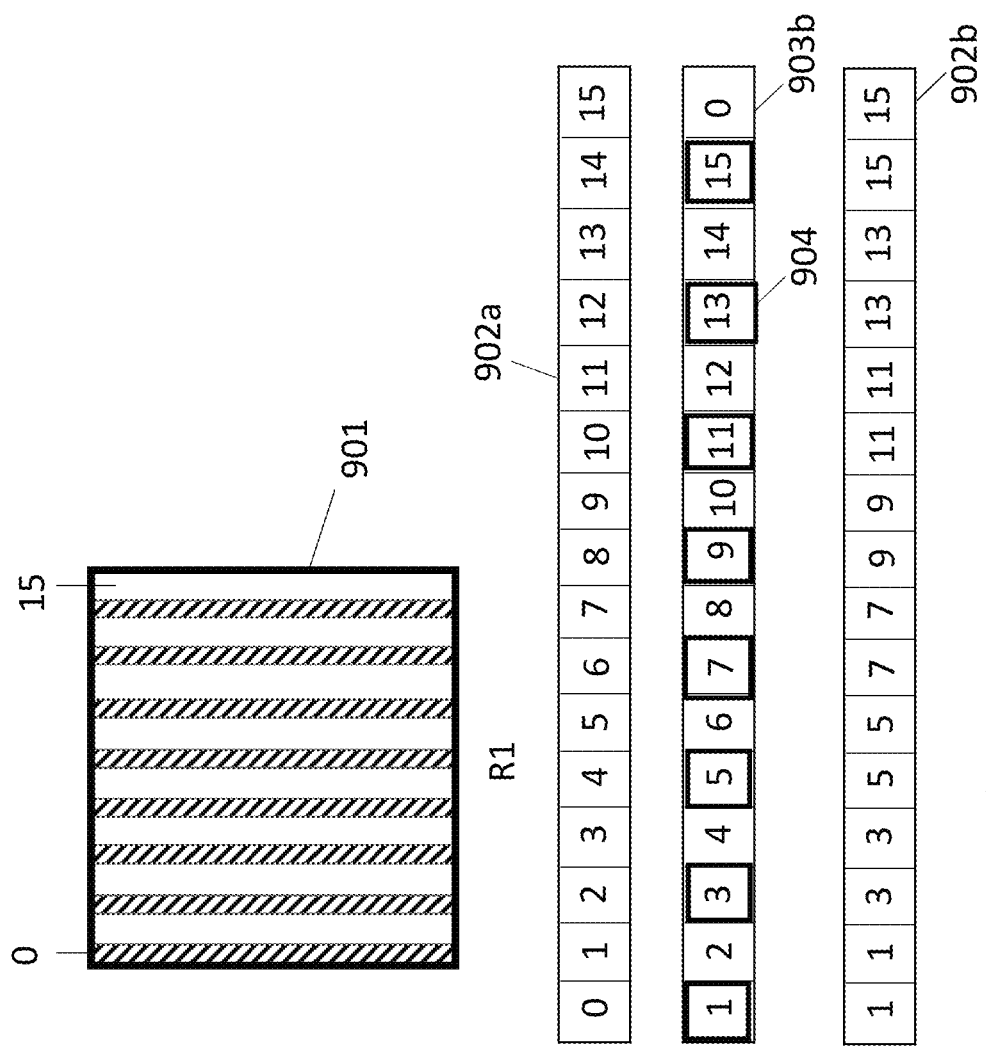

FIG. 9b shows the execution of a first mask instruction that shifts the content in R1 to the left by 1 and, according to a first mask operand (MASK_1), writes the shifted content only into every other column of R1. Register state 902a depicts the initial state of the contents of the R1 register level (which is identical to register state 902a of FIG. 9a). Transient state 903b depicts the shifted content within the shift register array after it has been shifted to the left by one pixel location but before any such information has actually been written into its destination register space. That is, transient state 903b corresponds to an intermediate state of the machine that exists during execution but before completion of the masked shift instruction. Transient state 903b also depicts through bolded boxes (such as bolded box 904 that surrounds column 13) which columns of the shifted content are to be written to the R1 level of the location they have been shifted to. From the depiction of FIG. 9b, the machine interprets the MASK_1 mask operand to only write the columns that are surrounded by a respective bolded box. These same columns are depicted as hashed stripes in the depiction of the R1 register space 901 of FIG. 9b.

Register state 902b shows the resultant register state of the R1 register level after the masked shift instruction completes. That is, register state 902b shows the state of the R1 register level after the shifted content of transient state 903b has been written into its destination register space in accordance with the MASK_1 operand. Here, the content of the bolded boxes of transient state 903b are depicted in the resultant register state 902b as having overwritten the content of these same columns of the initial register state 902a. The contents of the columns of the initial register state 902a that were not written to remain untouched.

Figure 9C:
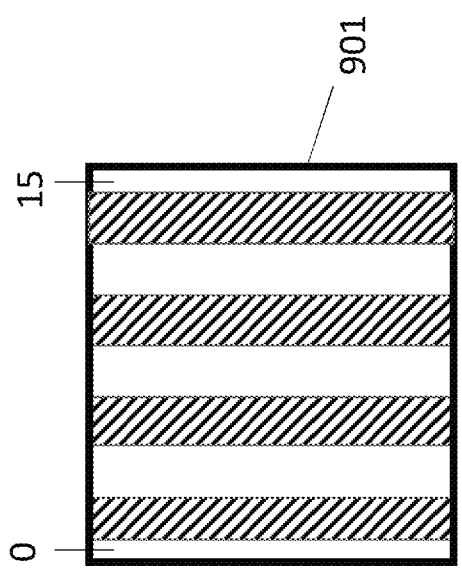

FIG. 9c shows the execution of a following, second masked shift instruction that shifts the content of the resultant of the first masked shift instruction 902b by two pixel units to the left. The second masked shift instruction includes a second mask operand MASK_2 that the machine interprets as a command to only write every other pair of columns of the shifted transient state 903c. The boxed content of the transient state 903c and the hashed stripes in FIG. 9c depict the interpretation of the MASK_2 operand. According to this interpretation, the execution of the second masked shift instruction creates resultant 902c in the R1 register level.

Figure 9D:
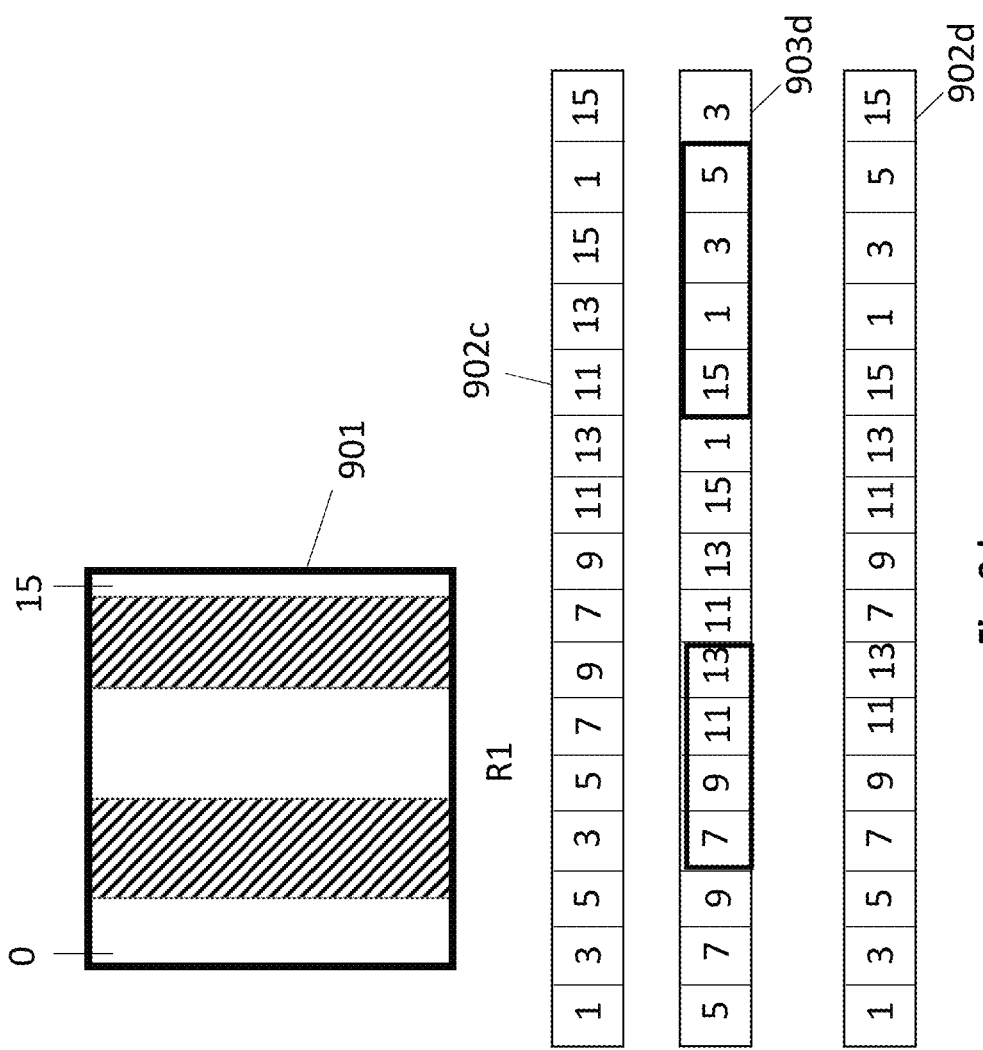

FIG. 9d shows the execution of a following, third masked shift instruction that shifts the content of the resultant of the second masked shift instruction 902c by four pixel units to the left. The third masked shift instruction includes a third mask operand MASK_4 that the machine interprets as a command to only write every other quartet of columns of the shifted transient state 903d. The boxed content of the transient state 903d and the hashed stripes in FIG. 9d depict the interpretation of the MASK_4 operand. According to this interpretation, the execution of the third masked shift instruction creates resultant 902d in the R1 register level.

Figure 9E:
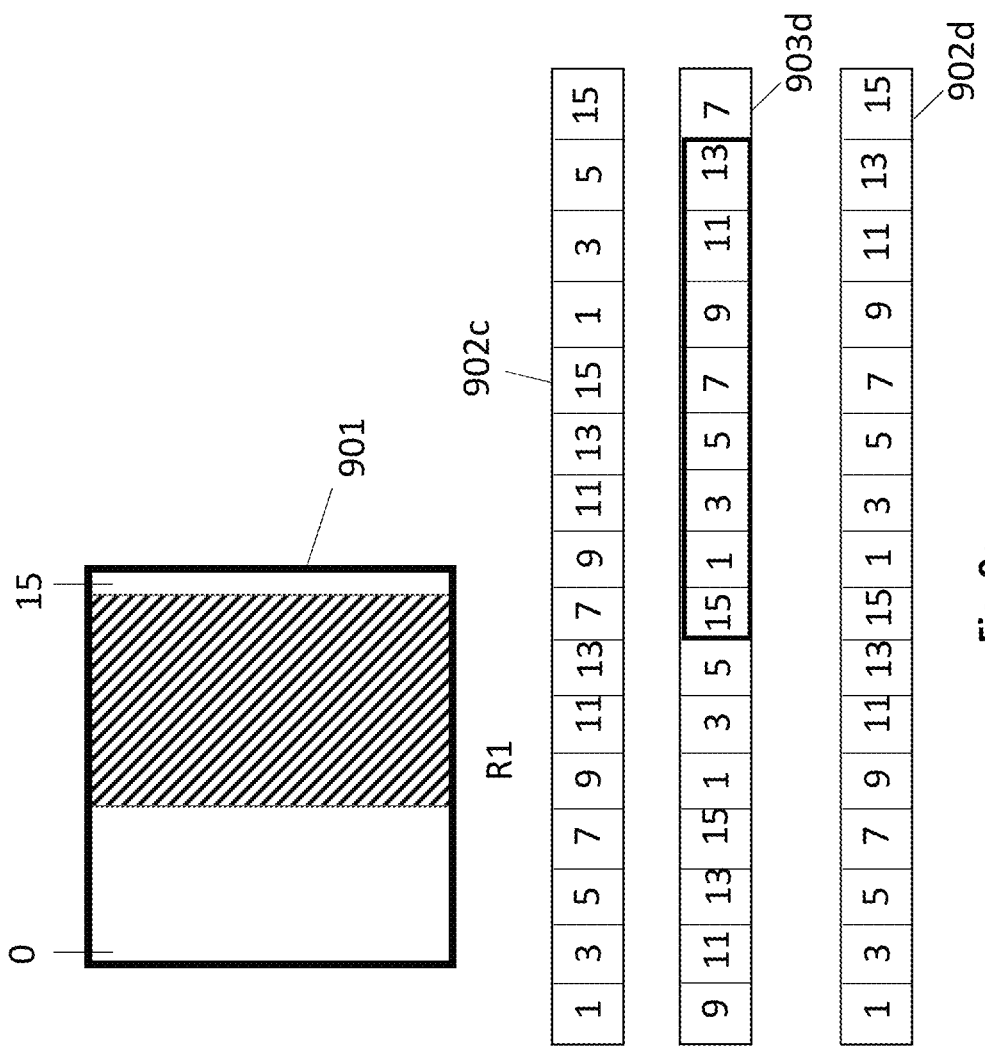

FIG. 9e shows the execution of a following, fourth masked shift instruction that shifts the content of the resultant of the third masked shift instruction 902d by eight pixel units to the left. The fourth masked shift instruction includes a fourth mask operand MASK_8 that the machine interprets as a command to only write an octet of neighboring columns of the shifted transient state 903d. The boxed content of the transient state 903e and the hashed stripes in FIG. 9e depict the interpretation of the MASK_8 operand. According to this interpretation, the execution of the fourth masked shift instruction creates resultant 902e in the R1 register level. Resultant 902e corresponds to the resultant of the overall compaction algorithm. Here, note that the left half of the columns include only the odd columns in order. As such, the overall size of the initial image state 902a has been reduced by one half. Here, note that if the halo had been included in the discussion of the algorithm columns 17 and 19 would have followed column 15 in order.

c. Expansion

FIGS. 10a through 10e show another set of data movements that use masked shift instructions to increase the footprint size of image data. Here, as is understood in the art, image data is made larger through "up-sampling" which adds more pixels to an existing set of pixels that define an image to increase the size of the image. In the example of FIGS. 10a through 10e, the image size is doubled by repeating each column of data twice in the image array.

Figure 10A:
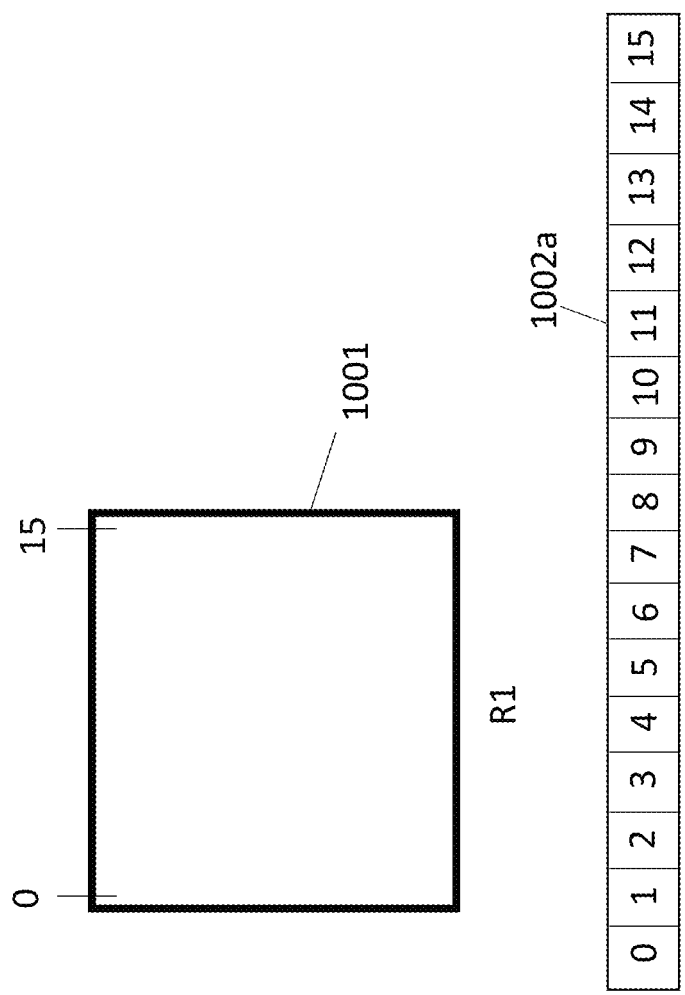

FIG. 10a shows a depiction of the initial state prior to execution of the algorithm. Here, assume the image data to be expanded is contained in the R1 level of the two dimensional shift register array. For simplicity only the execution lane array area 1001 is depicted. Also, for ease of drawing, the register content is identified by column numbers in register space 1002a. Again, the R1 content of the two dimensional shift register contains columns 0 through 15 of image space which consume the area of the execution lane array. Again the halo region is ignored.

FIG. 10b shows the execution of a first mask instruction that shifts the content in R1 to the right by four and, according to a MASK_8 operand, writes an octet of shifted neighboring columns into R1. Register state 1002a depicts the initial state of the contents of the R1 register level (which is identical to register state 1002a of FIG. 10a). Transient state 1003b depicts the shifted content within the shift register array after it has been shifted to the right by four pixel locations but before any such information has actually been written into its destination register space. Transient state 1003b also depicts through bolded boxes which columns of the shifted content are to be written to the R1 level of the location they have been shifted to. These same columns are depicted as hashed stripes in the depiction of the R1 register space 1001 of FIG. 10b.

Register state 1002b shows the resultant register state of the R1 register level after the masked shift instruction completes. That is, register state 1002b shows the state of the R1 register level after the shifted content of transient state 1003b has been written into its destination register space in accordance with the MASK_8 operand. Here, the content of the bolded boxes of transient state 1003b are depicted in the resultant register state 1002b as having overwritten the content of these same columns of the initial register state 1002a. The contents of the columns of the initial register state 1002a that were not written to remain untouched.

Figure 10C:
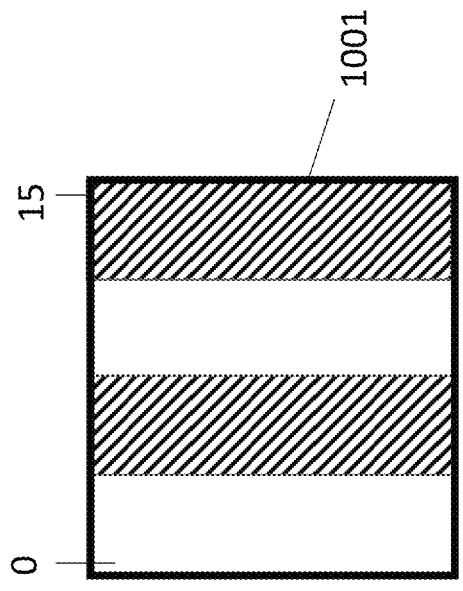

FIG. 10c shows the execution of a following, second masked shift instruction that shifts the content of the resultant of the first masked shift instruction 902b by two pixel units to the right. The second masked shift instruction includes a second mask operand MASK_4 that the machine interprets as a command to only write every other quartet of columns of the shifted transient state 1003c. The boxed content of the transient state 1003c and the hashed stripes in FIG. 10c depict the interpretation of the MASK_4 operand. According to this interpretation, the execution of the second masked shift instruction creates resultant 1002c in the R1 register level.

Figure 10D:
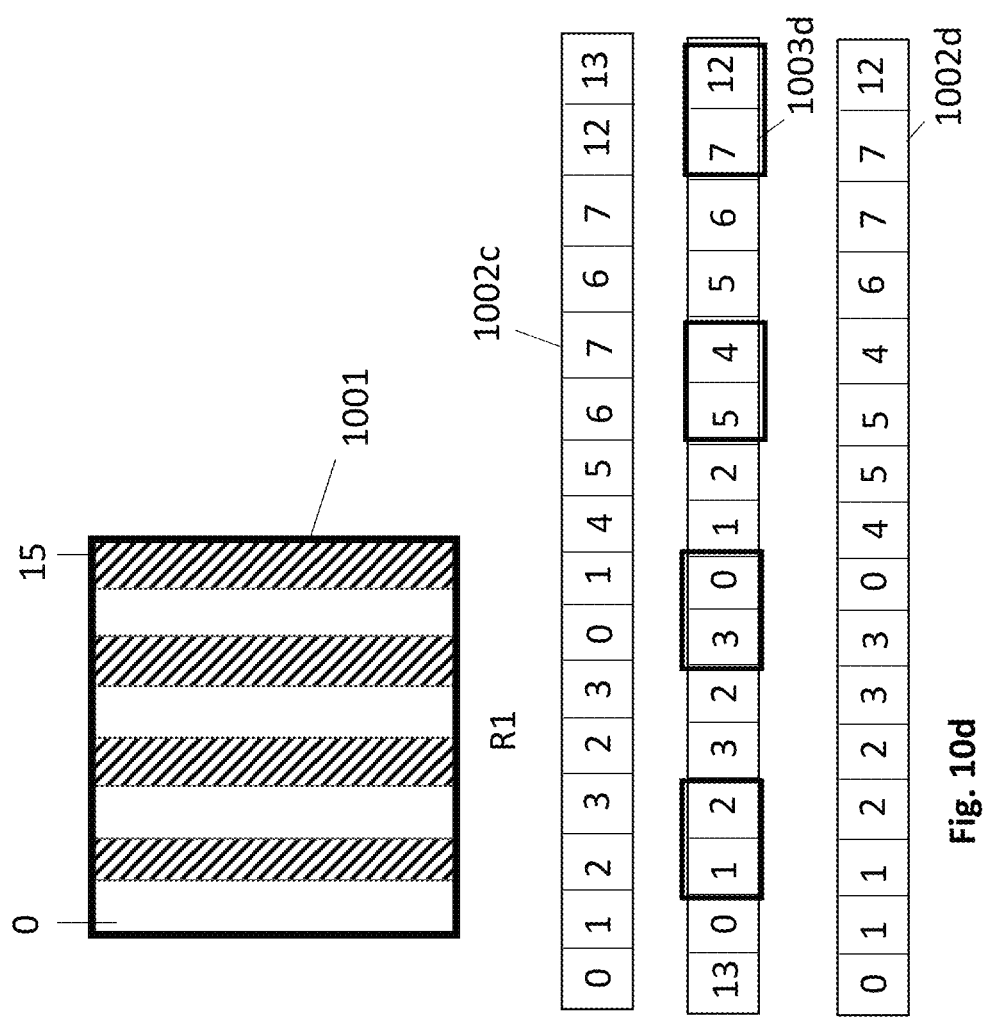

FIG. 10d shows the execution of a following, third masked shift instruction that shifts the content of the resultant of the second masked shift instruction 1002c by one pixel unit to the right. The third masked shift instruction includes a third mask operand MASK_2 that the machine interprets as a command to only write every other pair of columns of the shifted transient state 1003d. The boxed content of the transient state 1003d and the hashed stripes in FIG. 10d depict the interpretation of the MASK_2 operand. According to this interpretation, the execution of the third masked shift instruction creates resultant 1002d in the R1 register level.

Figure 10E:
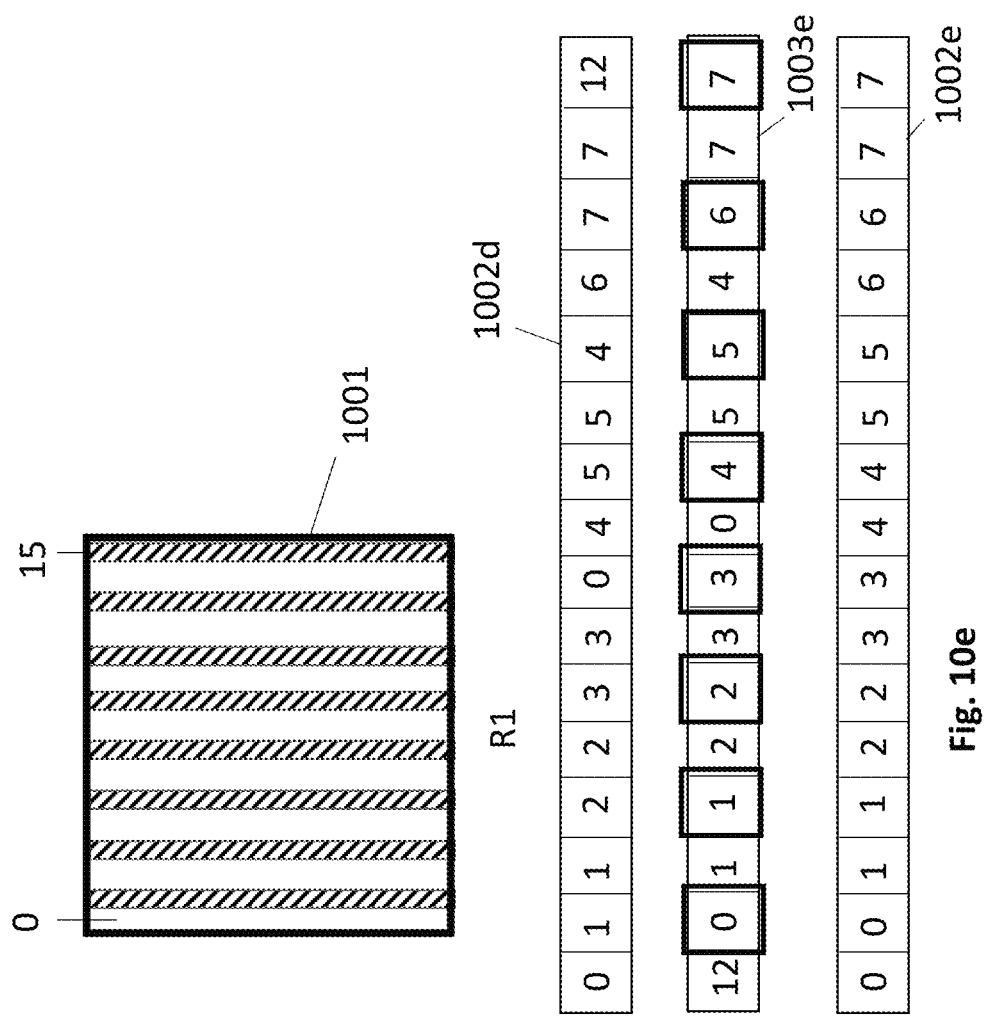

FIG. 10e shows the execution of a following, fourth masked shift instruction that shifts the content of the resultant of the third masked shift instruction 1002d by one pixel unit to the right. The fourth masked shift instruction includes a fourth mask operand MASK_1 that the machine interprets as a command to write every other column of the shifted transient state 903d. The boxed content of the transient state 1003e and the hashed stripes in FIG. 10e depict the interpretation of the MASK_1 operand. According to this interpretation, the execution of the fourth masked shift instruction creates resultant 1002e in the R1 register level. Resultant 1002e corresponds to the resultant of the overall expansion algorithm. Here, note that each column has been doubled as compared to the initial image state 1002a. As such, the overall size of the initial image state 902a has been doubled.

d. Broadcast

FIGS. 11a through 11e show another set of data movements that use masked shift instructions to repeat a single column across an entire image. Here, as is understood in the art. In the example of FIGS. 11a through 11e, the first column is repeated across the image array.

Figure 11A:
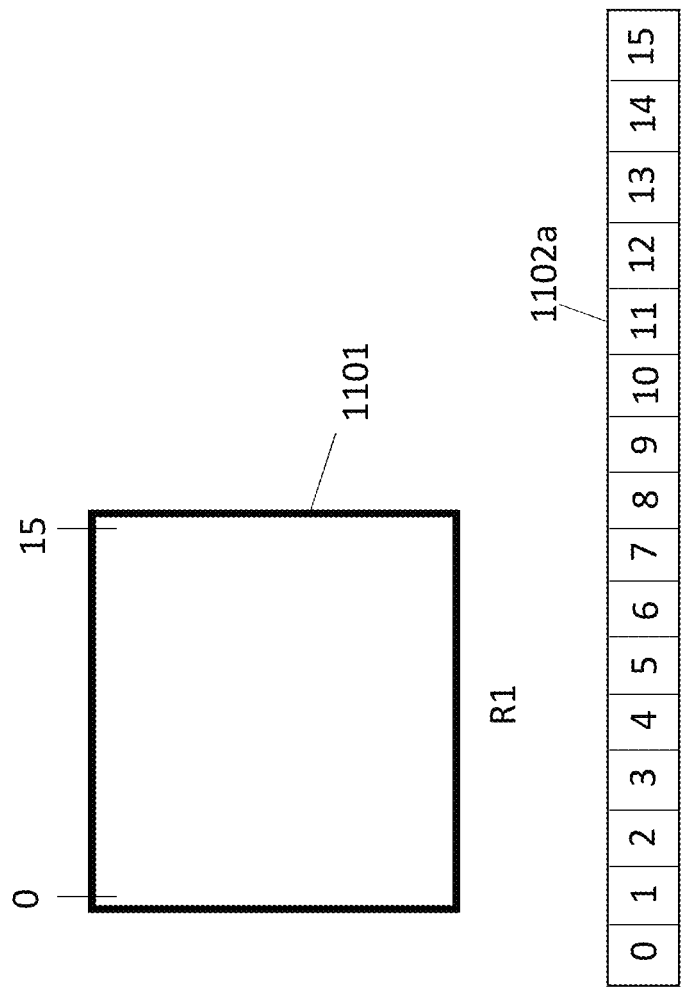

FIG. 11a shows a depiction of the initial state prior to execution of the algorithm. Here, assume the image data to be expanded is contained in the R1 level of the two dimensional shift register array. For simplicity only the execution lane array area 1101 is depicted. Also, for ease of drawing, the register content is identified by column numbers in register space 1102a. Again, the R1 content of the two dimensional shift register contains columns 0 through 15 of image space which consume the area of the execution lane array. Again the halo region is ignored.

Figure 11B:
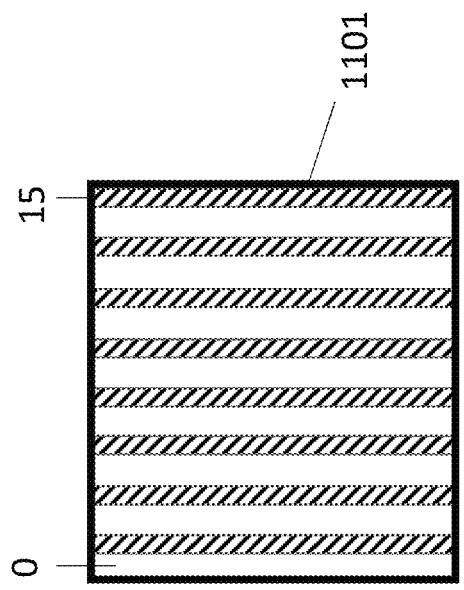

FIG. 11b shows the execution of a first mask instruction that shifts the content in R1 to the right by one and, according to a MASK_1 operand, writes every other column into R1. Register state 1102a depicts the initial state of the contents of the R1 register level (which is identical to register state 1102a of FIG. 11a). Transient state 1103b depicts the shifted content within the shift register array after it has been shifted to the right by one pixel location but before any such information has actually been written into its destination register space. Transient state 1103b also depicts through bolded boxes which columns of the shifted content are to be written to the R1 level of the location they have been shifted to. These same columns are depicted as hashed stripes in the depiction of the R1 register space 1101 of FIG. 11b.

Register state 1102b shows the resultant register state of the R1 register level after the masked shift instruction completes. That is, register state 1102b shows the state of the R1 register level after the shifted content of transient state 1103b has been written into its destination register space in accordance with the MASK_1 operand. Here, the content of the bolded boxes of transient state 1103b are depicted in the resultant register state 1102b as having overwritten the content of these same columns of the initial register state 1102a. The contents of the columns of the initial register state 1102a that were not written to remain untouched.

Figure 11C:
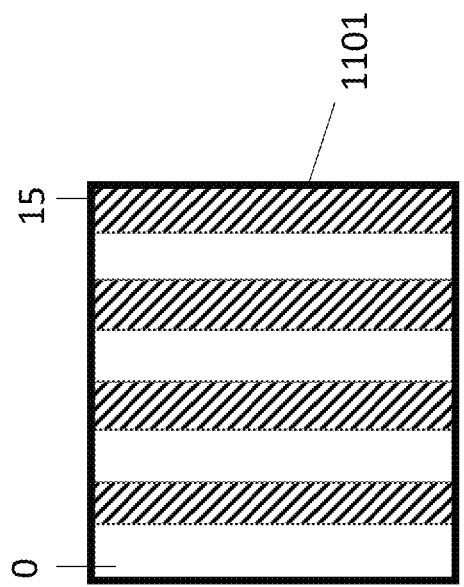

FIG. 11c shows the execution of a following, second masked shift instruction that shifts the content of the resultant of the first masked shift instruction 1102b by two pixel units to the right. The second masked shift instruction includes a second mask operand MASK_2 that the machine interprets as a command to only write every other pair of columns of the shifted transient state 1103c. The boxed content of the transient state 1103c and the hashed stripes in FIG. 11c depict the interpretation of the MASK_2 operand. According to this interpretation, the execution of the second masked shift instruction creates resultant 1102c in the R1 register level.

Figure 11D:
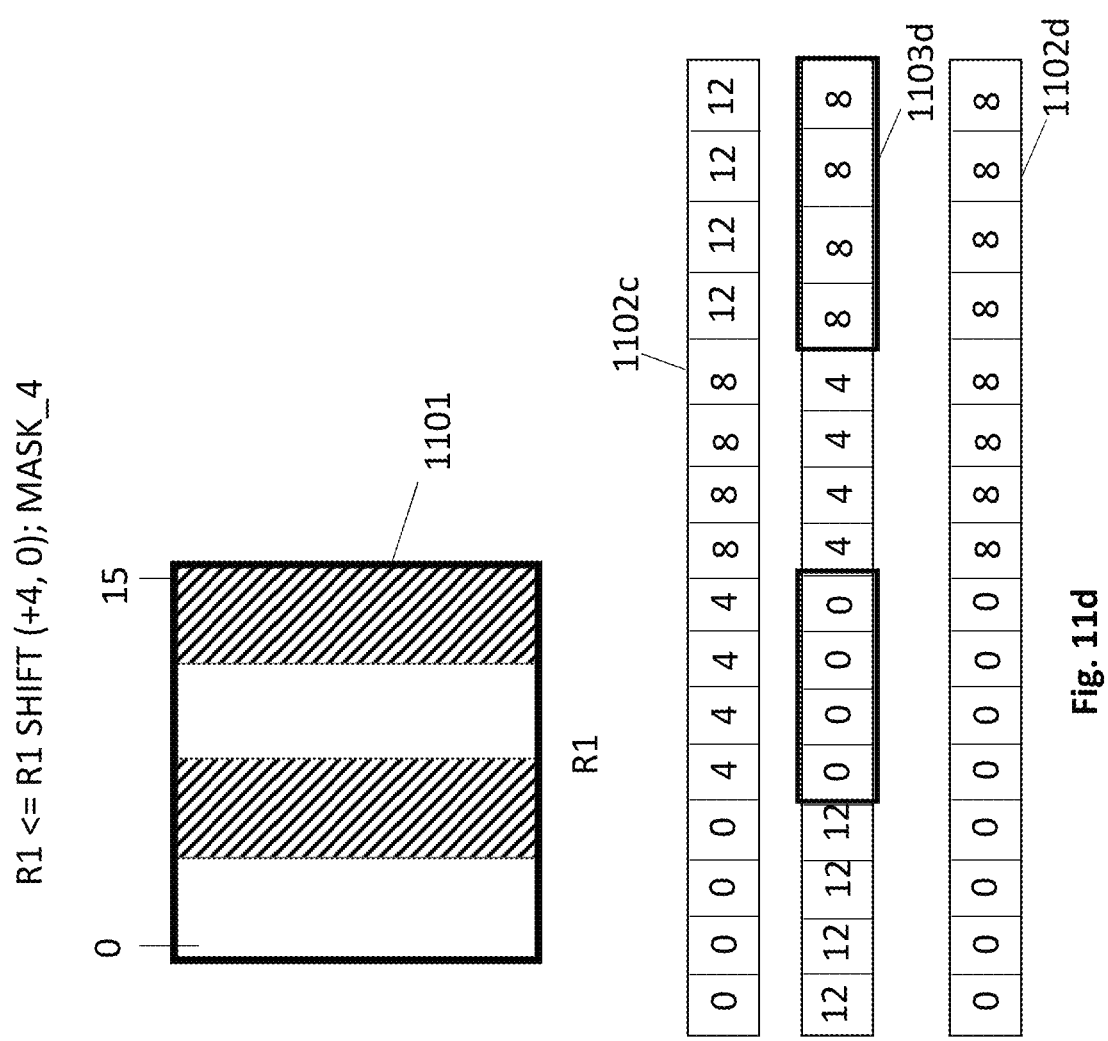

FIG. 11*d* shows the execution of a following, third masked shift instruction that shifts the content of the resultant of the third masked shift instruction 1102*c* by four pixel units to the right. The third masked shift instruction includes a third mask operand MASK_4 that the machine interprets as a command to only write every other quartet of columns of the shifted transient state 1103*d*. The boxed content of the transient state 1103*d* and the hashed stripes in FIG. 11*d* depict the interpretation of the MASK_4 operand. According to this interpretation, the execution of the third masked shift instruction creates resultant 1102*d* in the R1 register level.

FIG. 11*e* shows the execution of a following, fourth masked shift instruction that shifts the content of the resultant of the third masked shift instruction 1102*d* by eight pixel units to the right. The fourth masked shift instruction includes a fourth mask operand MASK_8 that the machine interprets as a command to write an octet of neighboring columns of the shifted transient state 1103*d*. The boxed content of the transient state 1103*e* and the hashed stripes in FIG. 11*e* depict the interpretation of the MASK_8 operand. According to this interpretation, the execution of the fourth masked shift instruction creates resultant 1102*e* in the R1 register level. Resultant 1102*e* corresponds to the resultant of the overall broadcast algorithm. Here, note that the first column (column 0) has been repeated across the image.

e. Butterfly Operations

Figure 12:
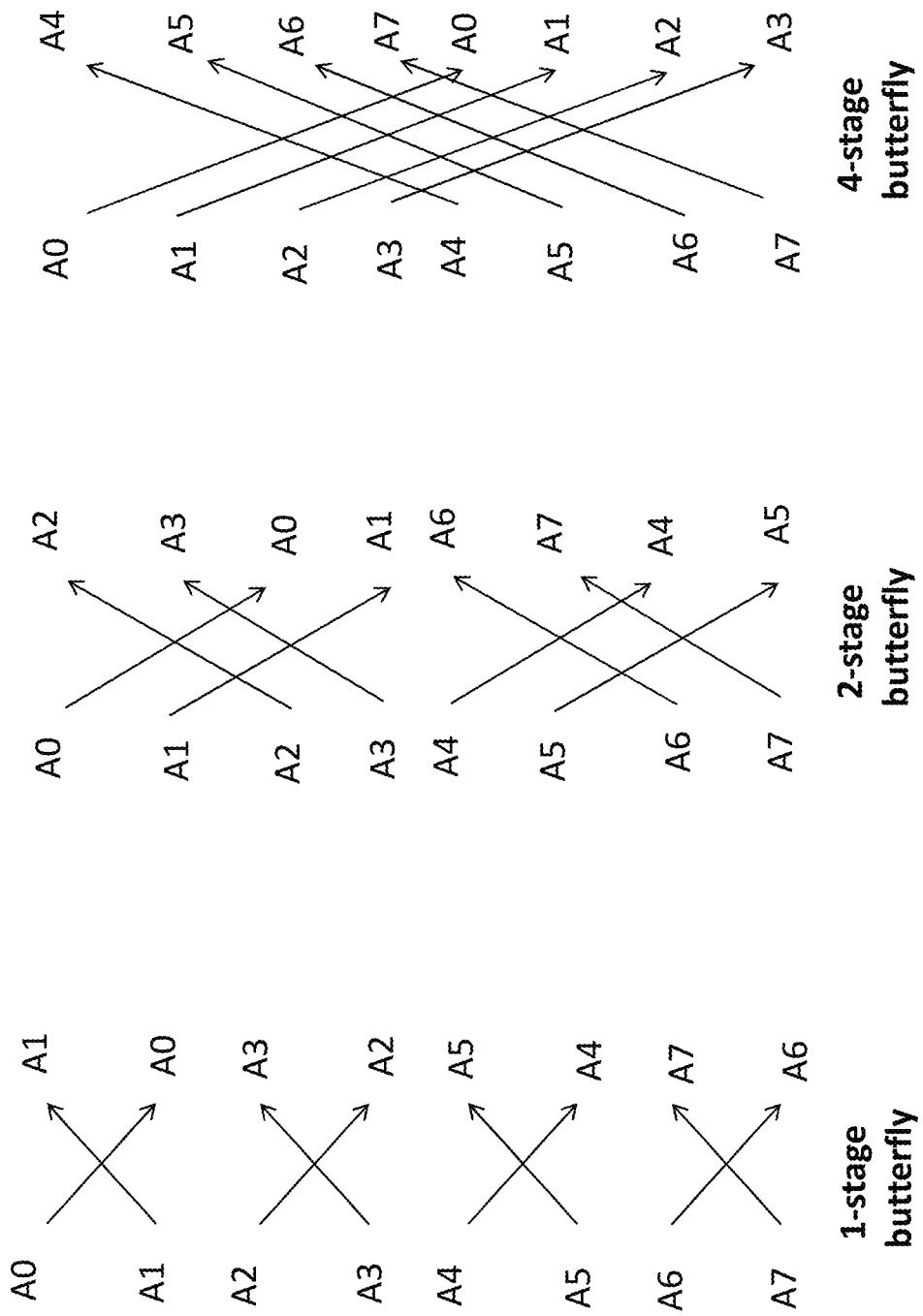
FIG. 12 shows 1, 2 and 4 stage butterfly operations.

As is known in the art, a fast fourier transform (FFT) is a faster, less computationally intensive approach to a discrete fourier transform. FFTs rely on special efficient algorithms to rapidly convert time or space domain data into frequency domain data. A critical component of such algorithms is a butterfly algorithm. An exemplary butterfly algorithm is depicted in FIG. 12. Here, a butterfly operation is defined by a stage where the specific stage determines an amount of swapping that transpires between elements of a same row or column. As is known in the art, a complete FFT includes performing mathematical operations on the swapped content of multiple, different stage butterfly operations in between the butterfly operations.

FIG. 12 shows each of 1, 2, and 4 stage butterfly operations. In the case of the 1 stage butterfly, neighboring elements are swapped. In the case of the 2 stage butterfly, neighboring pairs of elements are swapped. In the case of the 4 stage butterfly, neighboring quartets of elements are swapped. In the case of a two dimensional FFT, elements in a first array of signal data are swapped according to each of multiple butterfly stages with mathematical operations being performed on the swapped signal data elements.

Figure 13A:
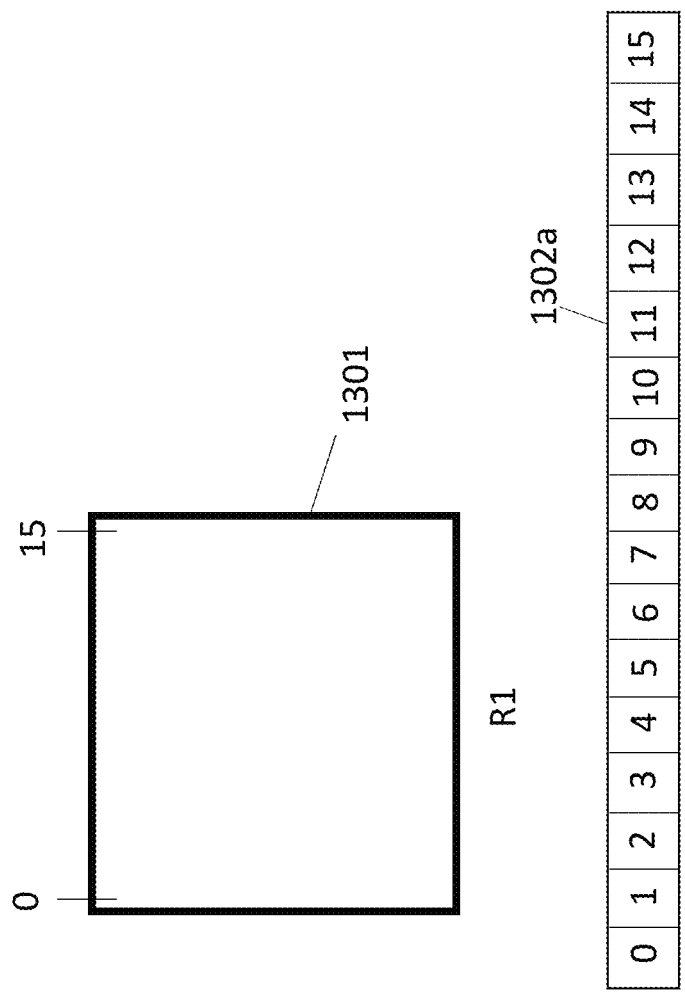
FIGS. 13a, 13b and 13c show a process for performing a 1 stage butterfly operation using a masked shift instruction.
Figure 13B:
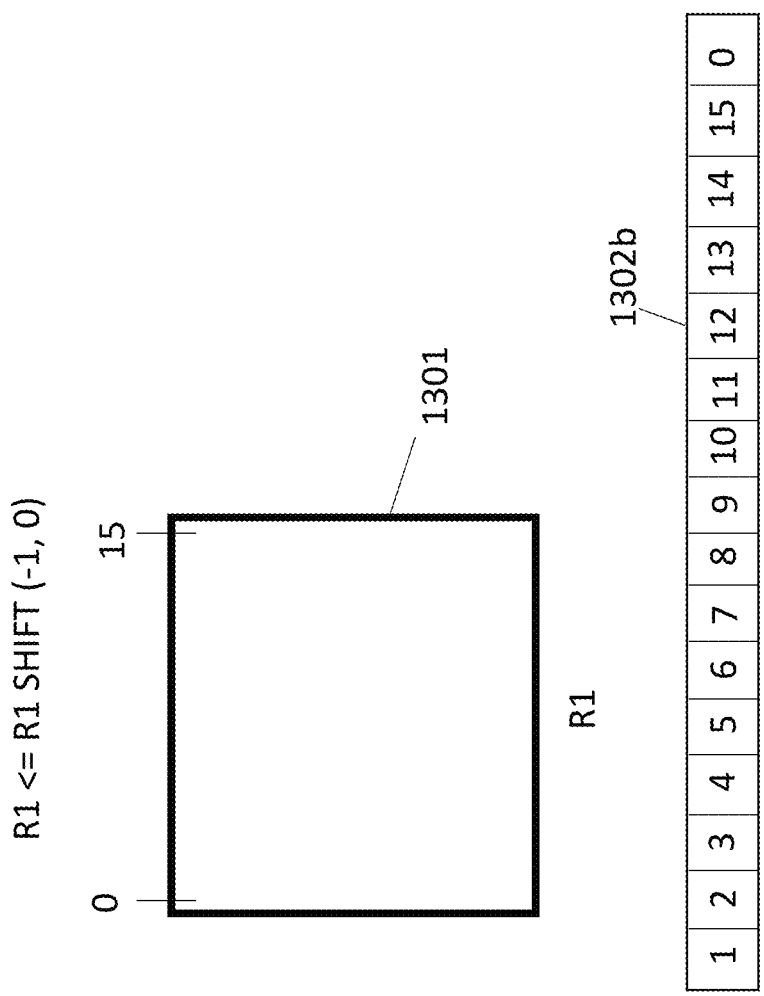
Figure 13C:
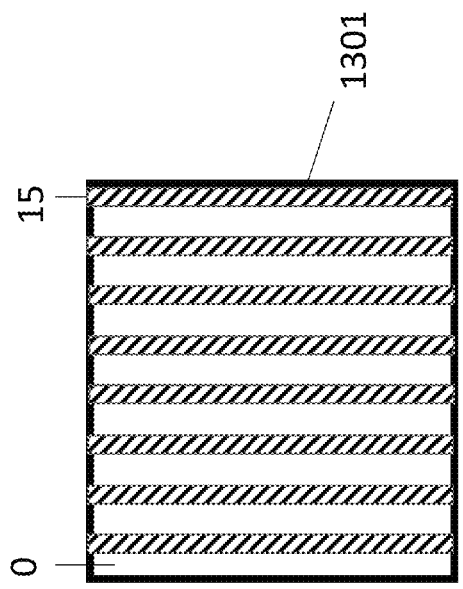

FIGS. 13*a* through 13*c* depict a 1 stage butterfly operation that uses a masked shift instruction. FIG. 13*a* shows a depiction of the initial state prior to execution of the algorithm. Here, assume the image data to be expanded is contained in the R1 level of the two dimensional shift register array. For simplicity only the execution lane array area 1301 is depicted. Also, for ease of drawing, the register content is identified by column numbers in register space 1302*a*. Again, the R1 content of the two dimensional shift register contains columns 0 through 15 of image space which consume the area of the execution lane array. Again the halo region is ignored.

FIG. 13*b* shows the execution of a first shift instruction that shifts the content in R1 to the left by one pixel unit to produce resultant 1302*b*. FIG. 13*c* shows the execution of a following, masked shift instruction that shifts the content of the resultant 1302*b* of the first shift instruction by two pixel units to the right. The masked shift instruction includes a mask operand MASK_1 that the machine interprets as a command to write every other column of the shifted transient state 1303*c*. The boxed content of the transient state 1303*c* and the hashed stripes in FIG. 13*c* depict the interpretation of the MASK_1 operand. According to this interpretation, the execution of the masked shift instruction creates resultant 1302*c* in the R1 register level, which, corresponds to a 1 stage butterfly resultant.

Figure 14A:
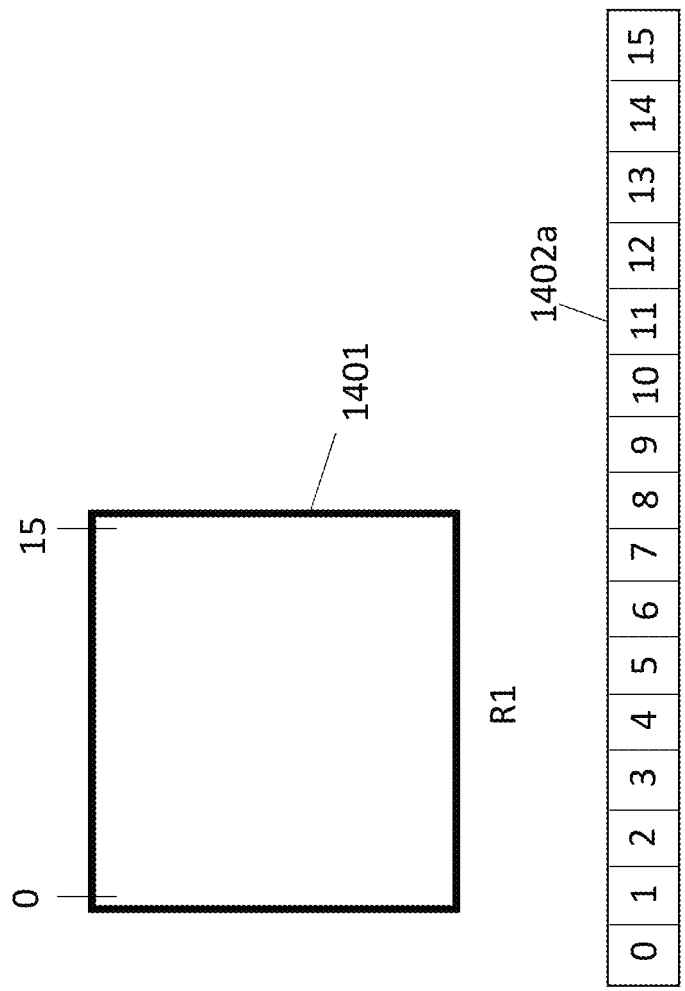
FIGS. 14a, 14b and 14c show a process for performing a 2 stage butterfly operation using a masked shift instruction.
Figure 14B:
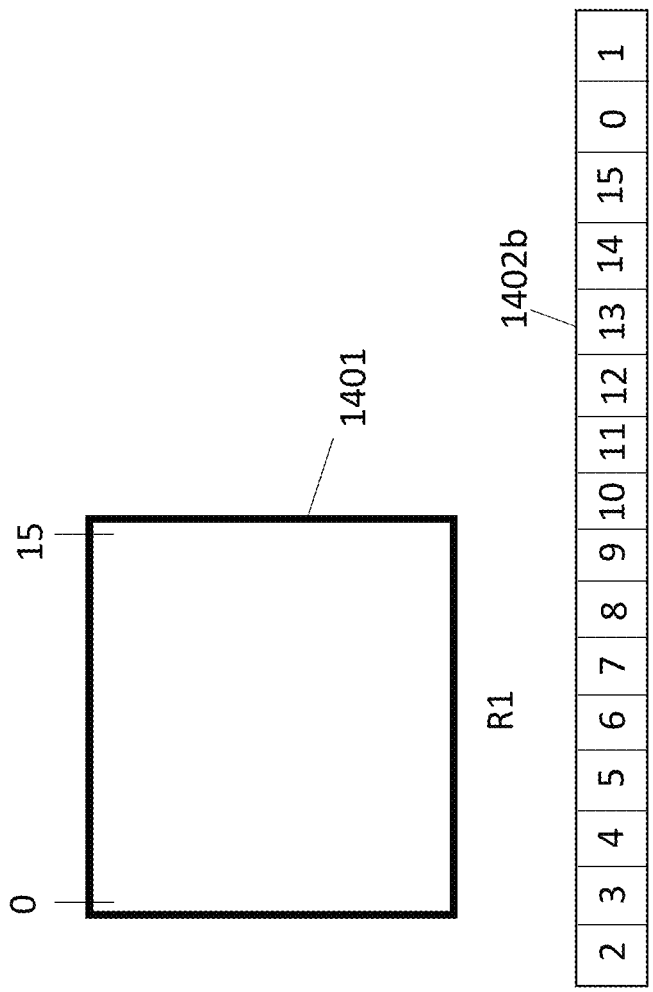
Figure 14C:
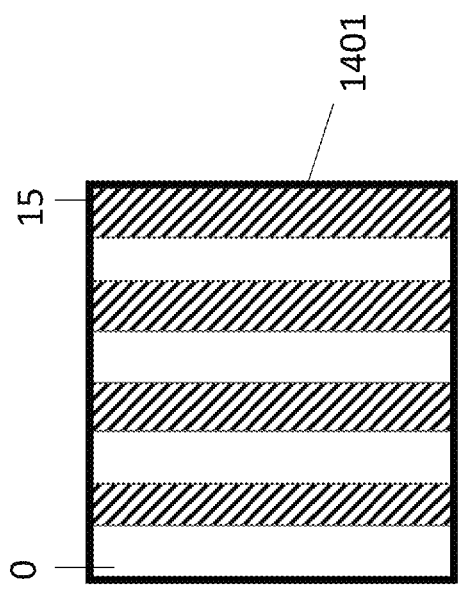

FIGS. 14*a* through 14*c* depict a 2 stage butterfly operation that uses a masked shift instruction. FIG. 14*a* shows a depiction of the initial state prior to execution of the algorithm. Here, assume the image data to be expanded is contained in the R1 level of the two dimensional shift register array. For simplicity only the execution lane array area 1401 is depicted. Also, for ease of drawing, the register content is identified by column numbers in register space 1402*a*. Again, the R1 content of the two dimensional shift register contains columns 0 through 15 of image space which consume the area of the execution lane array. Again the halo region is ignored.

FIG. 14*b* shows the execution of a first shift instruction that shifts the content in R1 to the left by two pixel units to produce resultant 1402*b*. FIG. 14*c* shows the execution of a following, masked shift instruction that shifts the content of the resultant 1402*b* of the first shift instruction by four pixel units to the right. The masked shift instruction includes a mask operand MASK_2 that the machine interprets as a command to write every other pair of columns of the shifted transient state 1403*c*. The boxed content of the transient state 1403*c* and the hashed stripes in FIG. 14*c* depict the interpretation of the MASK_2 operand. According to this interpretation, the execution of the masked shift instruction creates resultant 1402*c* in the R1 register level, which, corresponds to a 2 stage butterfly resultant.

Figure 15A:
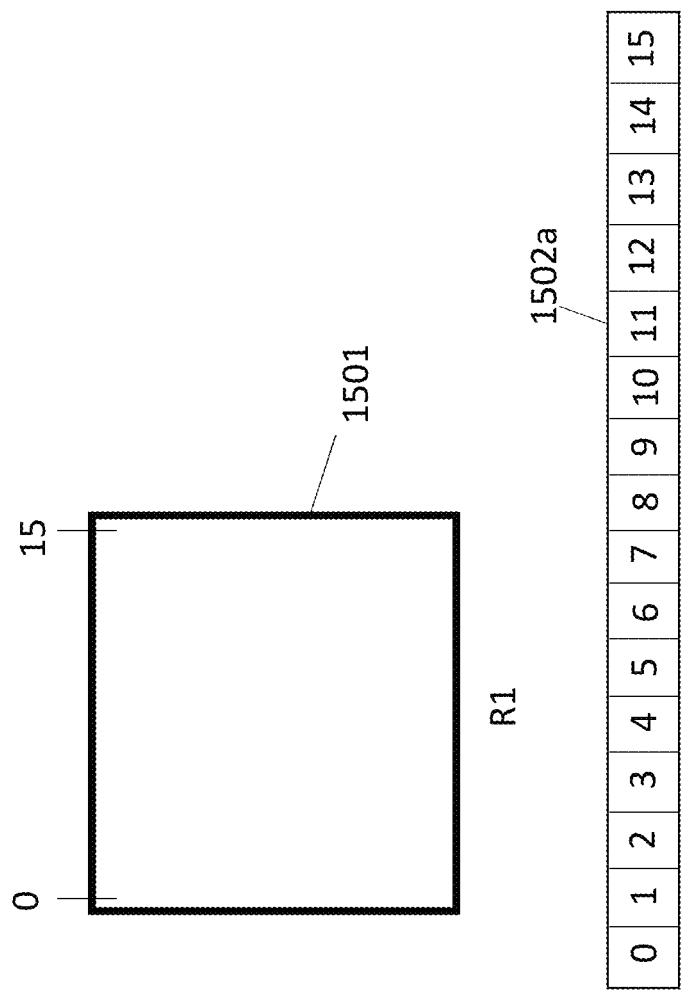
FIGS. 15a, 15b and 15c show a process for performing a 4 stage butterfly operation using a masked shift instruction.
Figure 15B:
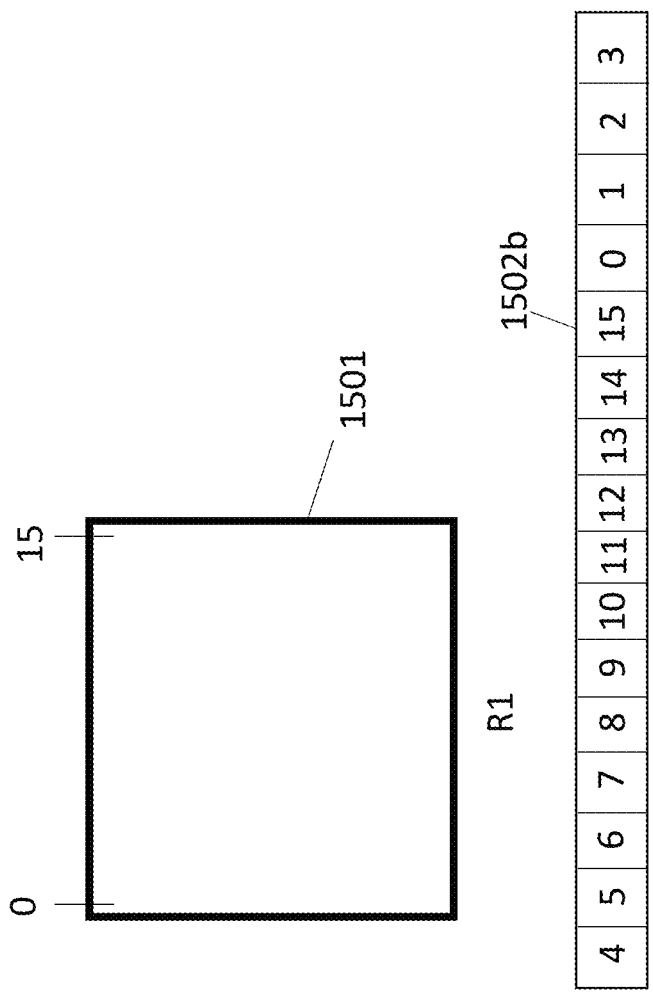
Figure 15C:
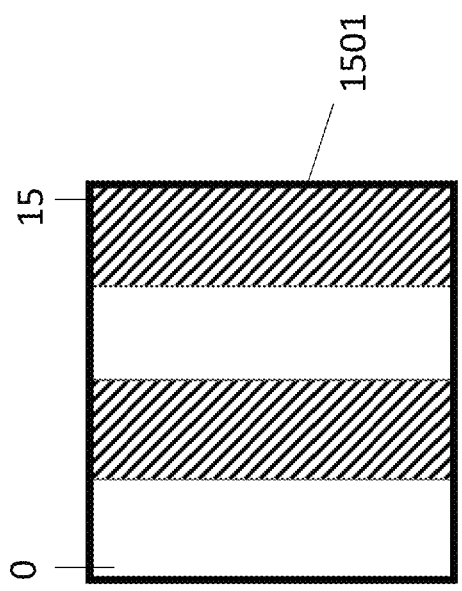

FIGS. 15*a* through 15*c* depict a 4 stage butterfly operation that uses a masked shift instruction. FIG. 15*a* shows a depiction of the initial state prior to execution of the algorithm. Here, assume the image data to be expanded is contained in the R1 level of the two dimensional shift register array. For simplicity only the execution lane array area 1501 is depicted. Also, for ease of drawing, the register content is identified by column numbers in register space 1502*a*. Again, the R1 content of the two dimensional shift register contains columns 0 through 15 of image space which consume the area of the execution lane array. Again the halo region is ignored.

FIG. 15*b* shows the execution of a first shift instruction that shifts the content in R1 to the left by four pixel units to produce resultant 1502*b*. FIG. 14*c* shows the execution of a following, masked shift instruction that shifts the content of the resultant 1502*b* of the first shift instruction by eight pixel units to the right. The masked shift instruction includes a mask operand MASK_4 that the machine interprets as a command to write every other quartet of columns of the shifted transient state 1503*c*. The boxed content of the transient state 1503*c* and the hashed stripes in FIG. 15*c* depict the interpretation of the MASK_4 operand. According to this interpretation, the execution of the masked shift instruction creates resultant 1502*c* in the R1 register level, which, corresponds to a 4 stage butterfly resultant.

e. Additional Comments

As indicated in the discussions above, a mask operand may be used to inform the machine as to which shifted columns should be written and which shifted columns should not be written. Here, referring back to FIG. 3*b*, the mask operand may, e.g., consume an operand field of the 2D ALU instruction 352 or consume the immediate operand field 354. Alternatively the instruction format described therein may be further modified to include the mask operand by extending the size of the instruction to include an additional mask operand field.

Traditional mask operands typically reserve one bit for each data lane that masking control is desired over. In the masking algorithms above, masking granularity was implemented at a per column basis. For the exemplary two-dimensional shift register described therein having, e.g., 16 columns for execution lane area and 4 columns for halo area, the mask operand may be implemented as a 20 bit vector (one bit for each column in the two dimensional shift register). In some systems reserving that many bits for a mask operand presents complications.

As such, rather than implement the mask operand as a true input data operand, instead, the mask "operand" is implemented as a code that behaves more like an opcode extension or encoded, smaller bit width input mask operand. Here, recall from the discussions above that the different mask writing patterns were implemented with five different forms of mask information: MASK_1, MASK_2, MASK_4, MASK_8 and MASK_16. Five different forms of mask information can be expressed with as a few as 3 bits. Thus, in various embodiments, the different writing patterns are expressed in the instruction format with a reduced bit size code that informs the machine what the pattern is rather than with a dedicated bit for each column.

Note that different phases of a same writing pattern may exist. For example, both of FIGS. 9d and 10c depict a MASK_4 writing pattern. However, although both patterns write to every other quartet of columns, which specific quartets are written to is different. According to one approach, the mask code field is expanded to reserve a unique bit pattern not only for different write patterns (in terms of how many neighboring columns are written to) but also for different phases of a same write pattern. Alternatively, all write patterns have only one phase and initial state (and final state) information is shifted to allow for correct overall algorithm operation with only one write pattern. For example, the initial state of FIG. 10a could be shifted to the left so that the write pattern of FIG. 9d is useable with the masked shift operation of FIG. 10c.

Also note that any/all algorithms expressed above could be performed vertically (whereas all the examples described above were horizontal) with defined write patterns that dictate how many neighboring rows are written to and shifts that shift along a vertical axis rather than a horizontal axis. Finally, the two-dimensional shift register array can be specially wired to support the specific shift amounts specified by a mask code (e.g., shifts of 1, 2, 4, 8, etc.).

Figure 16:
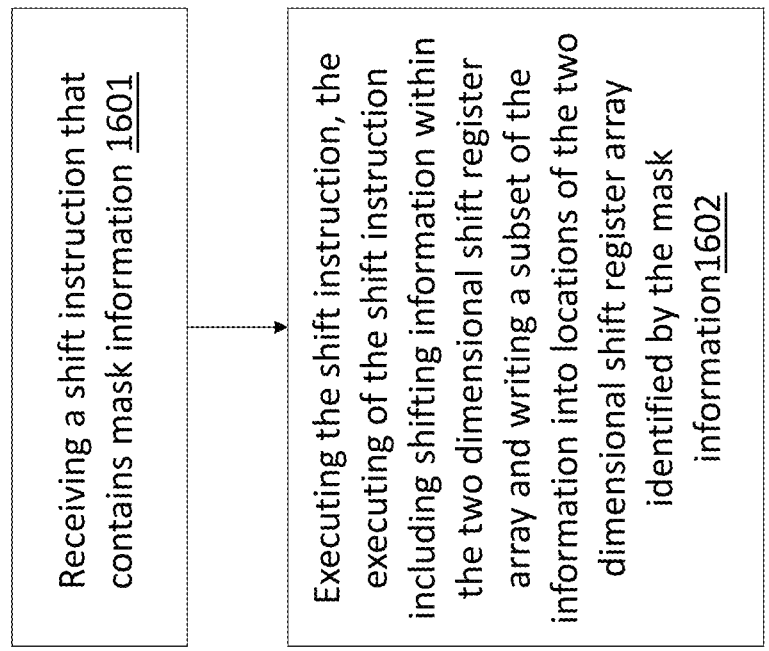
FIG. 16 shows a method of executing a masked shift instruction.

FIG. 16 shows a method described above as performed by an image processor having an array of execution lanes and a two dimensional shift register array. As observed in FIG. 16, the method includes receiving a shift instruction that contains mask information 1601. The method also includes executing the shift instruction 1602. The executing of the shift instruction includes shifting information within the two dimensional shift register array and writing a subset of the information into locations of the two dimensional shift register array identified by the mask information.

3.0 Construction of Low Level Program Code

Figure 17:
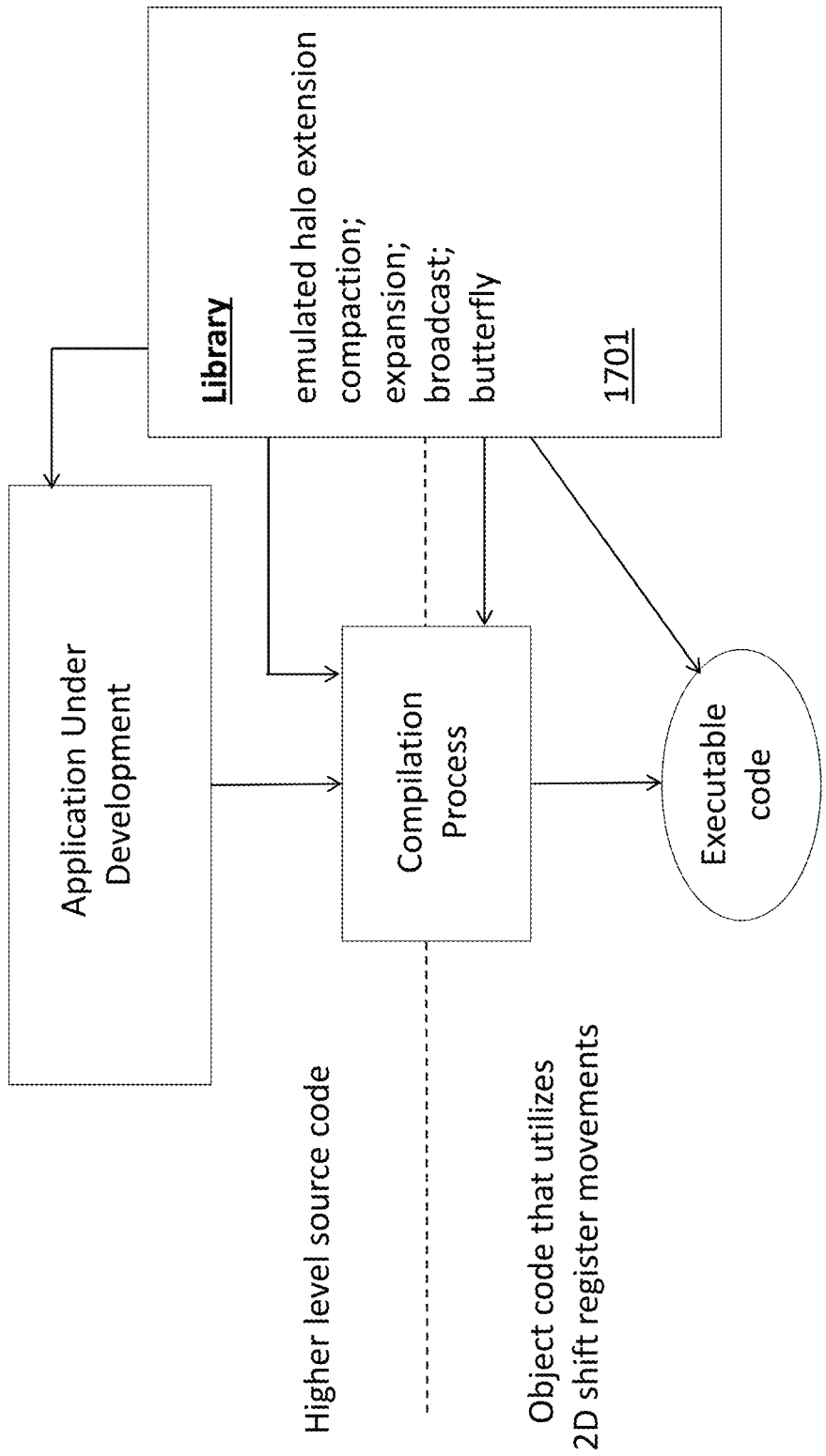
FIG. 17 shows a program code development environment.

FIG. 17 shows a pre-runtime development environment in which a programmer designs a high level image processing function and the application development environment provides for any/all of the aforementioned operations of section 2.0 that utilize a masked shift instruction so that the developer does not have to write them from scratch.

Here, the developer may specifically call out any of the operations discussed above in Section 2.0 and/or the development environment automatically provides them from a library 1701 in response. Alternatively or in combination, the developer's need for such operations may be implied or deduced (such as a butterfly in the case of a 2D FFT) and the development environment automatically inserts program code from the library 1701 that performs these functions (e.g., as part of a compilation process).

Thus, the program code that performs the above described operations or alternate embodiments thereof may be expressed in higher level program code or lower level object code. In various embodiments, a higher level virtual instruction set architecture (ISA) code may specify data values to be operated upon as memory reads having x,y address coordinates, while, the object code may instead comprehend these data accesses as two-dimensional shift register operations (such as any of the shift operations described above or similar embodiments).

A compiler may convert the x,y reads in the development environment into corresponding shifts of the two dimensional shift register that are specified object code (e.g., a read in the development environment having x,y coordinates (+2, +2) may be realized in object code as a shift to the left two spaces and a shift down of two spaces). Depending on environment, the developer may have visibility into both of these levels (or, e.g., just the higher virtual ISA level). In still yet other embodiments, such prewritten routines may be invoked during runtime (e.g., by a just-in-time compiler) rather than pre-runtime.

4.0 Concluding Statements

From the preceding sections is pertinent to recognize that an image processor as described above in Section 1.0 may be embodied in hardware on a computer system (e.g., as part of a handheld device's System on Chip (SOC) that processes data from the handheld device's camera).

It is pertinent to point out that the various image processor architecture features described above are not necessarily limited to image processing in the traditional sense and therefore may be applied to other applications that may (or may not) cause the image processor to be re-characterized. For example, if any of the various image processor architecture features described above were to be used in the creation and/or generation and/or rendering of animation as opposed to the processing of actual camera images, the image processor may be characterized as a graphics processing unit. Additionally, the image processor architectural features described above may be applied to other technical applications such as video processing, vision processing, image recognition and/or machine learning. Applied in this manner, the image processor may be integrated with (e.g., as a co-processor to) a more general purpose processor (e.g., that is or is part of a CPU of computing system), or, may be a stand alone processor within a computing system.

The hardware design embodiments discussed above may be embodied within a semiconductor chip and/or as a description of a circuit design for eventual targeting toward a semiconductor manufacturing process. In the case of the later, such circuit descriptions may take of the form of a (e.g., VHDL or Verilog) register transfer level (RTL) circuit description, a gate level circuit description, a transistor level circuit description or mask description or various combinations thereof. Circuit descriptions are typically embodied on a computer readable storage medium (such as a CD-ROM or other type of storage technology).

From the preceding sections is pertinent to recognize that an image processor as described above may be embodied in hardware on a computer system (e.g., as part of a handheld device's System on Chip (SOC) that processes data from the handheld device's camera). In cases where the image processor is embodied as a hardware circuit, note that the image data that is processed by the image processor may be received directly from a camera. Here, the image processor may be part of a discrete camera, or, part of a computing system having an integrated camera. In the case of the later the image data may be received directly from the camera or from the computing system's system memory (e.g., the camera sends its image data to system memory rather than the image processor). Note also that many of the features described in the preceding sections may be applicable to a graphics processor unit (which renders animation).

Figure 18:
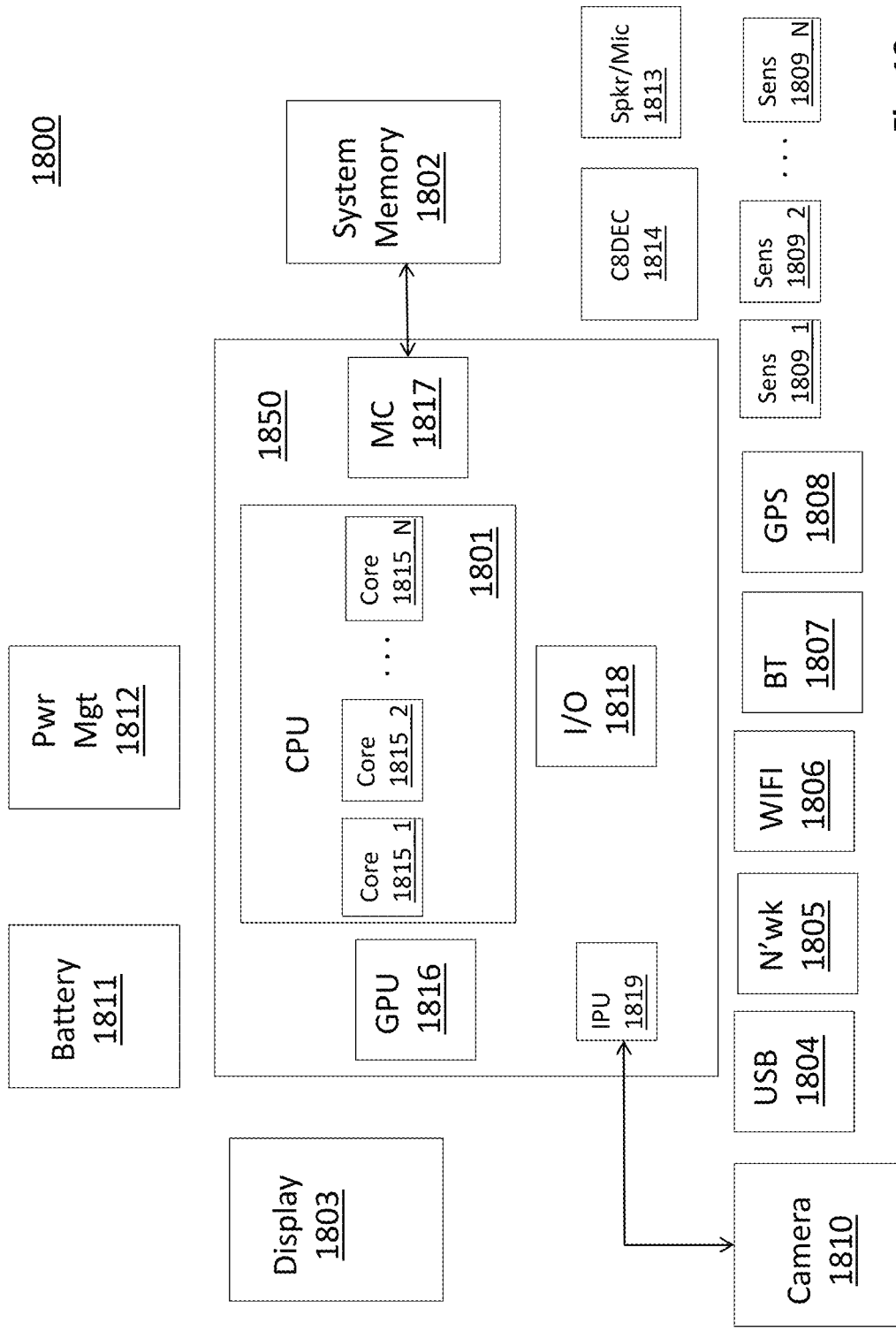
FIG. 18 shows a computing system.

FIG. 18 provides an exemplary depiction of a computing system. Many of the components of the computing system described below are applicable to a computing system having an integrated camera and associated image processor (e.g., a handheld device such as a smartphone or tablet computer). Those of ordinary skill will be able to easily delineate between the two.

As observed in FIG. 18, the basic computing system may include a central processing unit 1801 (which may include, e.g., a plurality of general purpose processing cores 1815_1 through 1815_N and a main memory controller 1817 disposed on a multi-core processor or applications processor), system memory 1802, a display 1803 (e.g., touchscreen, flat-panel), a local wired point-to-point link (e.g., USB) interface 1804, various network I/O functions 1805 (such as an Ethernet interface and/or cellular modem subsystem), a wireless local area network (e.g., WiFi) interface 1806, a wireless point-to-point link (e.g., Bluetooth) interface 1807 and a Global Positioning System interface 1808, various sensors 1809_1 through 1809_N, one or more cameras 1810, a battery 1811, a power management control unit 1824, a speaker and microphone 1813 and an audio coder/decoder 1814.

An applications processor or multi-core processor 1850 may include one or more general purpose processing cores 1815 within its CPU 1801, one or more graphical processing units 1816, a memory management function 1817 (e.g., a memory controller), an I/O control function 1818 and an image processing unit 1819. The general purpose processing cores 1815 typically execute the operating system and application software of the computing system. The graphics processing units 1816 typically execute graphics intensive functions to, e.g., generate graphics information that is presented on the display 1803. The memory control function 1817 interfaces with the system memory 1802 to write/read data to/from system memory 1802. The power management control unit 1824 generally controls the power consumption of the system 1800.

The image processing unit 1819 may be implemented according to any of the image processing unit embodiments described at length above in the preceding sections. Alternatively or in combination, the IPU 1819 may be coupled to either or both of the GPU 1816 and CPU 1801 as a co-processor thereof. Additionally, in various embodiments, the GPU 1816 may be implemented with any of the image processor features described at length above.

Each of the touchscreen display 1803, the communication interfaces 1804-1807, the GPS interface 1808, the sensors 1809, the camera 1810, and the speaker/microphone codec 1813, 1814 all can be viewed as various forms of I/O (input and/or output) relative to the overall computing system including, where appropriate, an integrated peripheral device as well (e.g., the one or more cameras 1810). Depending on implementation, various ones of these I/O components may be integrated on the applications processor/multi-core processor 1850 or may be located off the die or outside the package of the applications processor/multi-core processor 1850.

In an embodiment one or more cameras 1810 includes a depth camera capable of measuring depth between the camera and an object in its field of view. Application software, operating system software, device driver software and/or firmware executing on a general purpose CPU core (or other functional block having an instruction execution pipeline to execute program code) of an applications processor or other processor may perform any of the functions described above including use of one or more masked shift instructions.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the elements may be downloaded as a computer program transferred from a remote computer (e.g., a server) to a requesting computer (e.g., a client) by way of data signals embodied in a carrier wave or other propagation medium via a communication link (e.g., a modem or network connection).

In the foregoing specification, specific example embodiments have been described. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:
1. An image processor, comprising:
an array of processing elements; and
a two-dimensional shift-register array having circuitry configured to support execution of a masked shift instruction, the masked shift instruction having mask information, wherein the mask information specifies which array locations in the two-dimensional shift-register array are to be written to with data being shifted in the two-dimensional shift-register array, the two-dimensional shift-register array comprising masking logic circuitry configured to write the data being shifted into respective array locations in accordance with the mask information,
wherein each processing element of the array of processing elements is configured to receive the masked shift instruction and to decode the masked shift instruction by using the mask information and a respective location of the processing element within the array of processing elements to determine whether or not the processing element should enable writing, to a shift-register dedicated to the processing element, data shifted by a different respective processing element in the array of processing elements.

2. The image processor of claim 1, wherein the masking logic circuitry is distributed into array locations of the two-dimensional shift-register array.

3. The image processor of claim 1, wherein the mask information comprises a code that specifies a write pattern over a subset of the two-dimensional shift-register array.

4. The image processor of claim 1, wherein the mask information specifies which rows of the two-dimensional shift-register array are to be written to with data being shifted.

5. The image processor of claim 1, wherein the mask information specifies which columns of the two-dimensional shift-register array are to be written to with data being shifted.

6. The image processor of claim 1, wherein the mask information specifies that every other pair of columns of the two-dimensional shift-register array is to be written to with data being shifted.

7. The image processor of claim 1, wherein the mask information specifies that every other quartet of columns of the two-dimensional shift-register array is to be written to with data being shifted.

8. One or more non-transitory machine-readable storage media encoded with program code having a masked shift instruction, wherein executing the program code by an image processor comprising an array of processing elements and a two-dimensional shift-register array causes the image processor to perform operations comprising:
receiving, by the image processor, the masked shift instruction having mask information, wherein the mask information specifies which of the array locations are to be written to with data being shifted in the two-dimensional shift-register array;
providing the masked shift instruction to each processing element of the array of processing elements;
decoding, by each processing element of the array of processing elements, the masked shift instruction using the mask information and a respective location of the processing element within the array of processing elements to determine whether or not the processing element should enable writing, to a shift-register dedicated to the processing element, data shifted by a different respective processing element in the array of processing elements;
receiving, by each processing element of the array of processing elements, data shifted by a different respective processing element in the array of processing elements; and
writing, by each processing element of one or more processing elements, the data shifted by the different respective processing element based on decoding the masked shift instruction.

9. The one or more machine-readable storage media of claim 8, wherein the two-dimensional shift-register array comprises a halo region and wherein the operations further comprise performing a halo extension emulation method.

10. The one or more machine-readable storage media of claim 8, wherein the operations further comprise performing a compaction method that reduces an image size.

11. The one or more machine-readable storage media of claim 8, wherein the operations further comprise performing an expansion method that enlarges an image size.

12. The one or more machine-readable storage media of claim 8, wherein the operations further comprise performing a broadcast method that repeats a same value across multiple locations of the two-dimensional shift-register array.

13. The one or more machine-readable storage media of claim 8, wherein the operations further comprise performing a butterfly operation.

14. A computing system, comprising:
a plurality of general purpose processing cores;
a main memory;
a main memory controller coupled between the general purpose processing cores and the main memory;
an image processor, the image processor comprising
an array of processing elements; and
a two-dimensional shift-register array having circuitry configured to support execution of a masked shift instruction, the masked shift instruction having mask information, wherein the mask information specifies which array locations in the two-dimensional shift-register array are to be written to with data being shifted in the two-dimensional shift-register array, the two-dimensional shift-register array comprising masking logic circuitry configured to write the data being shifted into respective array locations in accordance with the mask information,
wherein each processing element of the array of processing elements is configured to receive the masked shift instruction and to decode the masked shift instruction by using the mask information and a respective location of the processing element within the array of processing elements to determine whether or not the processing element should enable writing, to a shift-register dedicated to the processing element, data shifted by a different respective processing element in the array of processing elements.

15. The computing system of claim 14, wherein the masking logic circuitry is distributed into array locations of the two-dimensional shift-register array.

16. The computing system of claim 14, wherein the mask information comprises a code that specifies a write pattern over a subset of the two-dimensional shift-register array.

17. The computing system of claim 14, wherein the mask information specifies which rows of the two-dimensional shift-register array are to be written to with data being shifted.

18. The computing system of claim 14, wherein the mask information specifies which columns of the two-dimensional shift-register array are to be written to with data being shifted.

19. The computing system of claim 14, wherein the mask information specifies that every other pair of columns of the two-dimensional shift-register array is to be written to with data being shifted.

20. The computing system of claim 19, wherein the mask information specifies that every other quartet of columns of the two-dimensional shift-register array is to be written to with data being shifted.

21. A method performed by an image processor comprising an array of processing elements and a two-dimensional shift-register array, the method comprising:
receiving, by the image processor, a masked shift instruction having mask information, wherein the mask information specifies which array locations in the two-dimensional shift-register array are to be written to with data being shifted in the two-dimensional shift-register array;
providing the masked shift instruction to each processing element of the array of processing elements;

decoding, by each processing element of the array of processing elements, the masked shift instruction using the mask information and a respective location of the processing element within the array of processing elements to determine whether or not the processing element should enable writing, to a shift-register dedicated to the processing element, data shifted by a different respective processing element in the array of processing elements;

receiving, by each processing element of the array of processing elements, data shifted by a different respective processing element in the array of processing elements; and writing, by each processing element of one or more processing elements, the data shifted by the different respective processing element based on decoding the masked shift instruction.

* * * * *

UNITED STATES PATENT AND TRADEMARK OFFICE
CERTIFICATE OF CORRECTION

| | |
|---|---|
| PATENT NO. | : 10,915,319 B2 |
| APPLICATION NO. | : 15/595600 |
| DATED | : February 9, 2021 |
| INVENTOR(S) | : Meixner |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 206 days.

Signed and Sealed this
Eleventh Day of October, 2022

Katherine Kelly Vidal
*Director of the United States Patent and Trademark Office*